(12) United States Patent
Sacolick et al.

(10) Patent No.: US 11,740,309 B2
(45) Date of Patent: Aug. 29, 2023

(54) SYSTEMS AND METHODS FOR DYNAMICALLY EXTENDING MAGNETIC RESONANCE IMAGING OF A SUBJECT

(71) Applicant: Hyperfine Operations, Inc., Guilford, CT (US)

(72) Inventors: Laura Sacolick, Guilford, CT (US); Carole Lazarus, Paris (FR); Rafael O'Halloran, Guilford, CT (US); Hadrien A. Dyvorne, New York, NY (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

(21) Appl. No.: 17/582,738

(22) Filed: Jan. 24, 2022

(65) Prior Publication Data
US 2022/0244334 A1     Aug. 4, 2022

Related U.S. Application Data

(60) Provisional application No. 63/144,727, filed on Feb. 2, 2021.

(51) Int. Cl.
*G01R 33/54*     (2006.01)
*G01R 33/48*     (2006.01)
(Continued)

(52) U.S. Cl.
CPC ....... *G01R 33/543* (2013.01); *G01R 33/4826* (2013.01); *G01R 33/5608* (2013.01); *G01R 33/56518* (2013.01)

(58) Field of Classification Search
None
See application file for complete search history.

(56) References Cited

U.S. PATENT DOCUMENTS

| 7,064,547 B1 | 6/2006 | King et al. |
| 8,126,230 B2 | 2/2012 | Wheaton et al. |
| (Continued) | | |

FOREIGN PATENT DOCUMENTS

EP     3 696 561 A1     8/2020

OTHER PUBLICATIONS

Invitation to Pay Additional Fees for International Application No. PCT/US2022/013502 mailed Apr. 20, 2022.
(Continued)

*Primary Examiner* — Rodney E Fuller
(74) *Attorney, Agent, or Firm* — Foley & Lardner LLP

(57) ABSTRACT

Systems and methods are provided herein for determining whether to extend scanning performed by a magnetic resonance imaging (MRI) system. According to some embodiments, there is provided a method for imaging a subject using an MRI system, comprising: obtaining data for generating at least one magnetic resonance image of the subject by operating the MRI system in accordance with a first pulse sequence; prior to completing the obtaining the data in accordance with the first pulse sequence, determining to collect additional data to augment and/or replace at least some of the obtained data; determining a second pulse sequence to use for obtaining the additional data; and after completing the obtaining the data in accordance with the first pulse sequence, obtaining the additional data by operating the MRI system in accordance with the second pulse sequence.

20 Claims, 14 Drawing Sheets

(51) Int. Cl.
  *G01R 33/56* (2006.01)
  *G01R 33/565* (2006.01)

(56) References Cited

U.S. PATENT DOCUMENTS

| | | | |
|---|---|---|---|
| 9,116,219 | B1 | 8/2015 | Posse |
| 10,101,425 | B2 | 10/2018 | Benner et al. |
| 2011/0311158 | A1* | 12/2011 | Griswold ......... G01R 33/56509 324/309 |
| 2013/0158384 | A1 | 6/2013 | Jeong et al. |
| 2015/0253409 | A1* | 9/2015 | Feiweier .......... G01R 33/56509 324/322 |
| 2016/0148375 | A1 | 5/2016 | Oh et al. |
| 2017/0016972 | A1 | 1/2017 | Bhat et al. |
| 2018/0267123 | A1 | 9/2018 | Beck |
| 2020/0405176 | A1* | 12/2020 | Nielsen ................ G01R 33/482 |
| 2021/0311152 | A1* | 10/2021 | Hu ................... G01R 33/56509 |
| 2022/0011393 | A1* | 1/2022 | Strauss ............ G01R 33/56509 |
| 2022/0065971 | A1* | 3/2022 | Polak ................ G01R 33/5608 |
| 2022/0244334 | A1* | 8/2022 | Sacolick .......... G01R 33/56509 |

OTHER PUBLICATIONS

International Search Report and Written Opinion for International Application No. PCT/US2022/013502 dated Jun. 13, 2022.
Barral et al., Real-time motion correction for high-resolution larynx imaging. Magnetic Resonance in Medicine. Jul. 2011;66(1):174-9.
Benner et al., Diffusion imaging with prospective motion correction and reacquisition. Magnetic resonance in medicine. Jul. 2011;66(1):154-67.
Lee et al., A prospective approach to correct for inter-image head rotation in fMRI. Magnetic resonance in medicine. Feb. 1998;39(2):234-43.
Thesen et al., Prospective acquisition correction for head motion with image-based tracking for real-time fMRI. Magnetic Resonance in Medicine: An Official Journal of the International Society for Magnetic Resonance in Medicine. Sep. 2000;44(3):457-65.

* cited by examiner

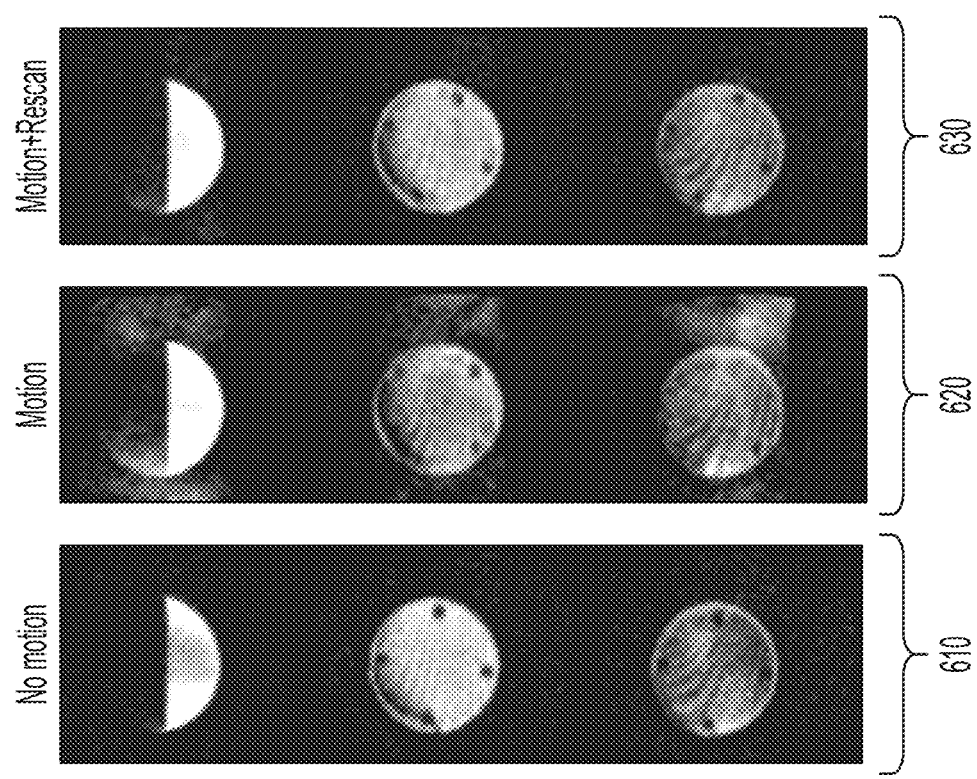

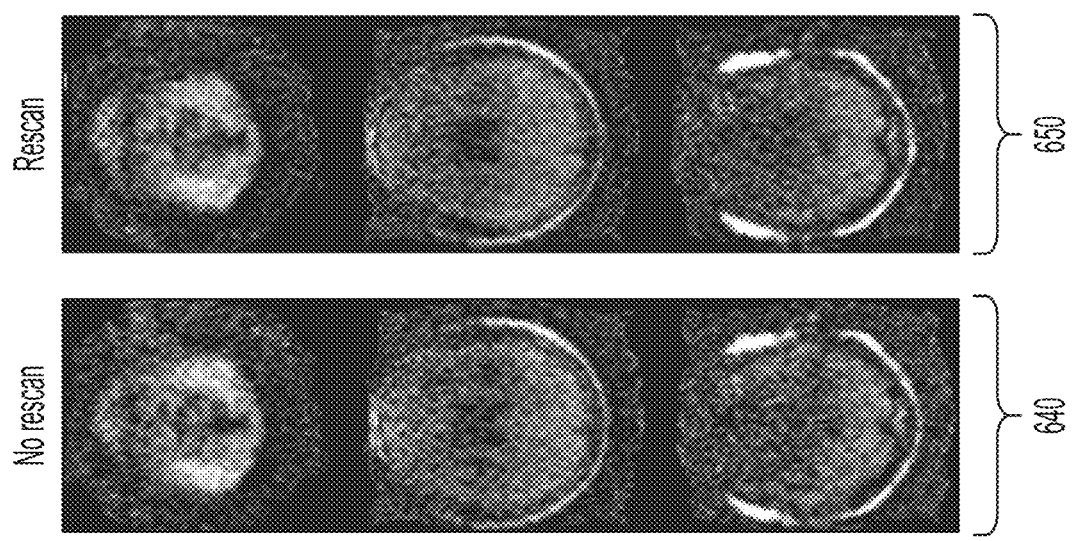

SYSTEMS AND METHODS FOR DYNAMICALLY EXTENDING MAGNETIC RESONANCE IMAGING OF A SUBJECT

CROSS-REFERENCE TO RELATED APPLICATIONS

The application claims the benefit under 35 U.S.C. § 119(e) of U.S. provisional patent application Ser. No. 63/144,727, entitled "SYSTEMS AND METHODS FOR DYNAMICALLY EXTENDING MAGNETIC RESONANCE IMAGING OF A SUBJECT," filed Feb. 2, 2021, which is incorporated by reference in its entirety herein.

BACKGROUND

Magnetic resonance imaging provides an important imaging modality for numerous applications and is widely utilized in clinical and research settings to produce images of the inside of the human body. MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments provide for a method for imaging a subject using a magnetic resonance imaging (MRI) system, the MRI system comprising a plurality of magnetics components including at least one gradient coil and at least one radio-frequency (RF) coil, the method comprising: obtaining data for generating at least one magnetic resonance image of the subject by operating the MRI system in accordance with a first pulse sequence; prior to completing the obtaining the data in accordance with the first pulse sequence, determining to collect additional data to augment and/or replace at least some of the obtained data; determining a second pulse sequence to use for obtaining the additional data; and after completing the obtaining the data in accordance with the first pulse sequence, obtaining the additional data by operating the MRI system in accordance with the second pulse sequence.

Some embodiments provide for a magnetic resonance imaging (MRI) system for imaging a subject, the MRI system comprising: a plurality of magnetics components including at least one gradient coil and at least one radio-frequency (RF) coil; and at least one controller configured to: obtain data for generating at least one magnetic resonance image of the subject by operating the MRI system in accordance with a first pulse sequence; prior to completing the obtaining the data in accordance with the first pulse sequence, determine to collect additional data to augment and/or replace at least some of the obtained data; determine a second pulse sequence to use for obtaining the additional data; and completing the obtaining the data in accordance with the first pulse sequence, obtaining the additional data by operating the MRI system in accordance with the second pulse sequence.

Some embodiments provide for a system comprising: at least one computer hardware processor; and at least one non-transitory computer-readable storage medium having encoded thereon executable instructions that, when executed by the at least one computer hardware processor, cause the at least one computer hardware to perform a method for imaging a subject using a magnetic resonance imaging (MRI) system, the MRI system comprising a plurality of magnetic components including at least one gradient coil and at least one radio-frequency (RF) coil, the method comprising: obtaining data for generating at least one magnetic resonance image of the subject by operating the MRI system in accordance with a first pulse sequence; prior to completing the obtaining the data in accordance with the first pulse sequence, determining to collect additional data to augment and/or replace at least some of the obtained data; determining a second pulse sequence to use for obtaining the additional data; and after completing the obtaining the data in accordance with the first pulse sequence, obtaining the additional data by operating the MRI system in accordance with the second pulse sequence.

Some embodiments provide for at least one non-transitory computer-readable storage medium having encoded thereon executable instructions that, when executed by at least one computer hardware processor, cause the at least one computer hardware processor to perform a method for imaging a subject using a magnetic resonance imaging (MRI) system, the MRI system comprising a plurality of magnetics components including at least one gradient coil and at least one radio-frequency (RF) coil, the method comprising: obtaining data for generating at least one magnetic resonance image of the subject by operating the MRI system in accordance with a first pulse sequence; prior to completing the obtaining the data in accordance with the first pulse sequence, determining to collect additional data to augment and/or replace at least some of the obtained data; determining a second pulse sequence to use for obtaining the additional data; and after completing the obtaining the data in accordance with the first pulse sequence, obtaining the additional data by operating the MRI system in accordance with the second pulse sequence.

BRIEF DESCRIPTION OF THE DRAWINGS

Various aspects and embodiments of the disclosed technology will be described with reference to the following figures. It should be appreciated that the figures are not necessarily drawn to scale. For purposes of clarity, not every component may be labeled in every drawing.

FIGS. 6A-6C illustrate example images acquired with and without the dynamic rescanning techniques described herein, in accordance with some embodiments of the technology described herein.

DETAILED DESCRIPTION (1) Introduction

Figure 1A:
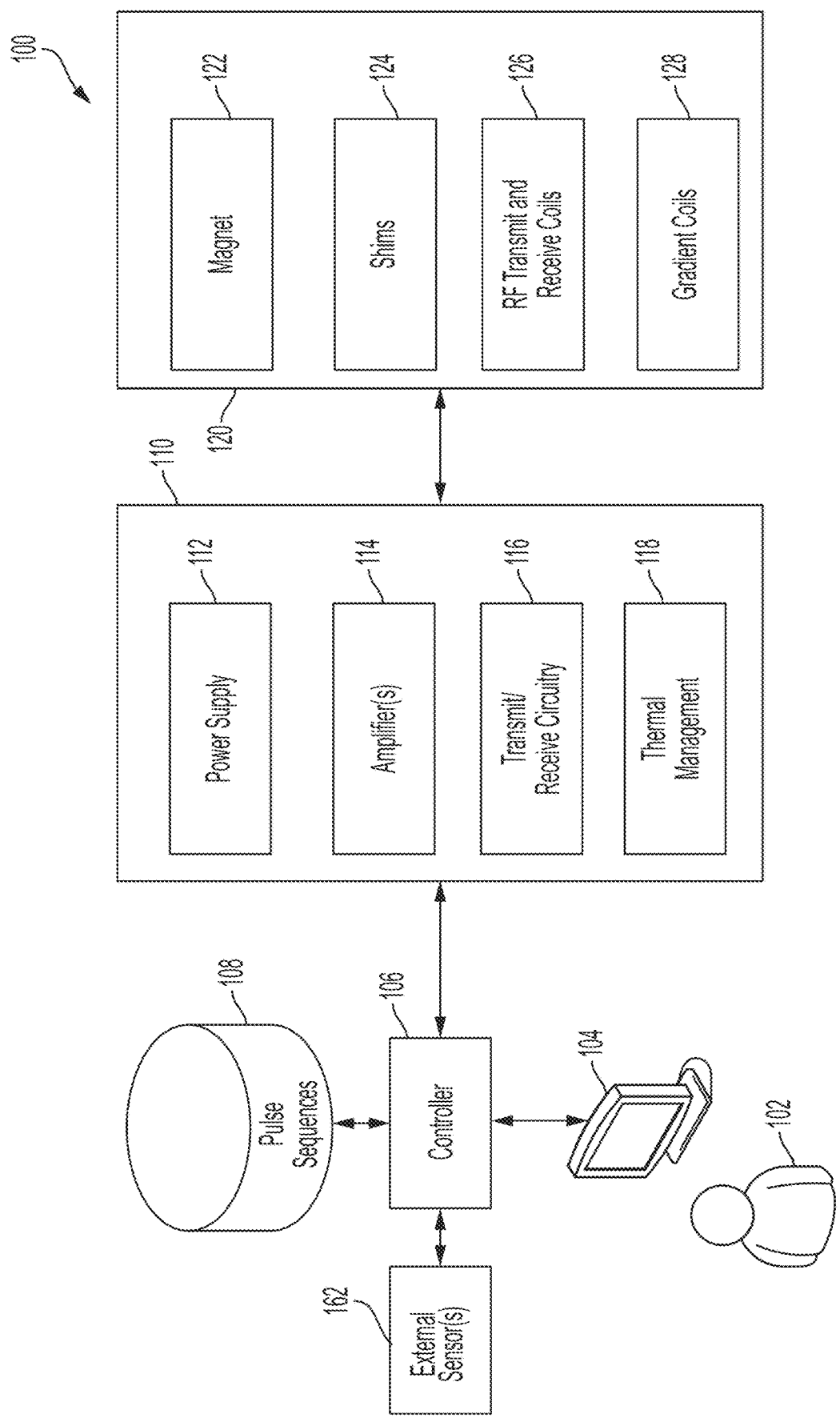
FIG. 1A illustrates example components of a magnetic resonance imaging system, in accordance with some embodiments of the technology described herein.

Aspects of the technology described herein relate to systems and methods for dynamically extending imaging performed by a magnetic resonance imaging system. According to some embodiments, techniques are provided for determining whether to extend imaging performed by an MRI system. According to some embodiments, techniques are further provided for determining how to perform the extended imaging (e.g., determining the pulse sequence to use to perform the extended imaging).

During acquisition of magnetic resonance imaging data, one or more processes can occur which degrade the quality of an image generated from the acquired MR data. For example, motion of a patient being imaged, components of an MRI system performing the imaging, and/or peripheral equipment may create artifacts appearing in the generated image. One or more other processes, such as magnetic field drift, changing hysteresis, uncompensated eddy currents and/or shim, and/or noise (e.g., external RF interference generated by any device(s) external to the MRI system, internal RF interference generated by any component(s) of the MRI system outside of its imaging region, and noise generated by the receive circuitry of the MRI system) may occur which degrade MR image quality. Poor image quality may reduce the usefulness of the acquired MR images, for example, in diagnosing and/or treating patients. In addition, even without the occurrence of such artifacts, the signal-to-noise ratio (SNR) of the data may be low, particularly for magnetic resonance imaging systems which operate in the low-field regime.

Conventional techniques account for artifacts in MR images by attempting to correct for the artifacts by processing the MR data subsequent to data acquisition. For example, post-processing the MR data may include applying one or more algorithms to the collected data in order to correct for the present of artifacts (e.g., due to motion, external RF interference, internal RF interference, noise, etc.). As another example, MR data which has been affected by one or more artifacts may be simply discarded. However, discarding bad MR data often results in an incomplete data set from which to generate an MR image, which significantly reduces the quality and medical relevance of the resulting image. In addition, post-processing algorithms may not be able to fully or accurately correct for all error sources present during data acquisition and may introduce their own artifacts into the MR image, which not only degrades the image quality but may make the resulting MR images less medically relevant or even usable.

The inventors have developed improved techniques for detecting and accounting for error sources which may degrade image quality. In particular, the inventors have developed techniques for dynamically detecting MR data which is of poor quality due to an error source and dynamically extending imaging performed by the MRI system to acquire additional data which can replace the previously acquired data. For example, poor quality data as a result of the one or more error sources described herein may be replaced with the additional data acquired during rescanning. Additionally or alternatively, the techniques developed by the inventors may be used to dynamically determine when it may be beneficial to augment collected MR data (even if the MR data is of acceptable quality) to increase the signal to noise ratio of the overall set of data collected and/or optimize any other suitable data quality measure. Such techniques result in improved correction of poor quality MR data without creating gaps in the MR dataset as well as efficiently increasing SNR and/or expanding the set of k-space locations sampled to collect the data set.

Some embodiments of the techniques described herein involve detecting poor quality data and determining whether to correct for the one or more error sources causing the poor quality of data by acquiring additional MR data to replace the poor quality data. Various techniques for detecting an error source resulting in poor quality data are described herein. In some embodiments, the techniques for determining whether to acquire additional MR data involve weighting the error source and/or poor quality data relative to other error sources to determine a priority of correcting the poor quality data.

The techniques described herein for determining whether and how to extend imaging may be performed dynamically, for example, during an initial period of obtaining data according to a first pulse sequence. In particular, it may be determined, prior to completing acquisition of an initial set of MR data, that further scanning to acquire additional MR data should be performed. The additional MR data may then be acquired subsequent to acquisition of the initial set of MR data, and the additional data may be added to the initial set of MR data. Acquisition of the additional MR data may be performed in a manner designed to maintain a steady state of MR signal. In some embodiments, acquisition of the additional MR data may be performed to correct for artifacts caused by one or more error sources, such as motion.

As described herein, in some embodiments, determining to extend imaging may be performed dynamically. A determination may be dynamic when it is performed based on data and/or information obtained (e.g., gathered directly, derived from data gathered directly) during operation of an MRI system in accordance with a pulse sequence (as opposed to based entirely on data and/or information available before commencing operation of the MRI system). For example, dynamically determining whether to extend imaging may be performed based on data obtained during imaging by the MRI system. As another example, dynamically determining whether to extend imaging may be performed based on data obtained by one or more sensors (e.g., patient movement sensors, noise sensors, interference sensors, etc.) during operation of an MRI system. Each such sensor may be part of the MRI system or be external to the MRI system. The sensor may be communicatively coupled (directly or indirectly) to the MRI system and/or to another computing device, which may be involved in making the determination of whether or not to extend imaging performed by the MRI system.

Thus, aspects of the technology described herein relate to systems and methods for determining whether to extend scanning performed by an MRI system. Some embodiments provide for techniques for imaging a subject using an MRI system, the MRI system comprising a plurality of magnetics components including at least one gradient coil and at least one radio-frequency (RF) coil, the method comprising: (1) obtaining data (e.g., spatial frequency data) for generating at least one magnetic resonance image of the subject by operating the MRI system in accordance with a first pulse sequence (e.g., a diffusion weighted imaging (DWI) pulse sequence, a spin echo pulse sequence); (2) prior to completing the obtaining the data in accordance with the first pulse sequence, determining to collect additional data to augment and/or replace at least some of the obtained data; (3) determining a second pulse sequence to use for obtaining the additional data (e.g., additional spatial frequency data); and (4) after completing the obtaining the data in accordance with the first pulse sequence, obtaining the additional data by operating the MRI system in accordance with the second pulse sequence.

In some embodiments, the first pulse sequence comprises a pre-programmed number of pulse repetition periods, and wherein completing obtaining the data in accordance with the first pulse sequence comprises completing operating the MRI system for the pre-programmed number of pulse repetition periods in accordance with parameters of the first pulse sequence.

In some embodiments, determining to collect the additional data is performed by determining that a first subset of the data obtained in accordance with the first pulse sequence was affected by one or more artifacts; and determining the second pulse sequence to use for obtaining the additional data comprises determining parameters for the second pulse sequence based, at least in part on parameters of the first pulse sequence used to obtain the first subset of the data. Determining the first subset of data was affected by the one or more artifacts may be performed using information indicating that the subject moved during collection of the first subset of data. In such embodiments, the method may further comprise obtaining the information indicating that the subject moved during collection of the first subset of data. For example, the information indicating the subject moved during collection of the first subset of data may be obtained by at least one sensor configured to detect motion of the subject (e.g., one or more RF sensors, an optical sensor, a gyroscope, and/or an accelerometer).

In some embodiments, obtaining the information indicating that the subject moved during collection of the first subset of data comprises determining that the subject moved by processing the data collected in accordance with the first pulse sequence. In such embodiments, the first pulse sequence may contain navigator RF pulses, and determining that the subject moved by processing the data may comprise determining that the subject moved by processing MR signals detected responsive to the navigator RF pulses. Processing the MR signals detected responsive to the navigator RF pulses may comprise determining magnitudes of the MR signals detected responsive to the navigator RF pulses. In some embodiments, processing the MR signals detected responsive to the navigator RF pulses may comprise determining deviations of magnitudes of the MR signals detected responsive to the navigator RF pulses from an average magnitude of the MR signals detected responsive to the navigator RF pulses.

In some embodiments, determining that the first subset of data was affected by the one or more artifacts is performed using information indicating the presence of one or more of external RF interference generated by one or more devices external to the MRI system, internal RF interference generated by one or more components of the MRI system outside of its imaging region, and/or noise generated by receive circuitry of the MRI system.

In such embodiments, the method may further comprise obtaining, using one or more sensors (e.g., at least one RF coil positioned outside of the imaging region of the MRI system and configured to detect external RF interference), information indicating that the first subset of data was affected by external RF interference generated by one or more devices external to the MRI system.

In some embodiments, determining to collect the additional data comprises: calculating a measure of MR image quality (e.g., a measure of signal to noise ratio (SNR)) using data collected in accordance with the first pulse sequence; and determining to collect the additional data when the measure of MR image quality is below a specified threshold and/or outside a specified range. In some embodiments, the first subset of data comprises at least one first magnetic resonance signal obtained using a first spatial encoding; obtaining the additional data is performed using the first spatial encoding to obtain at least one second magnetic resonance signal; and the method further comprises averaging the at least one first magnetic resonance signal and the at least one second magnetic resonance signal to increase the SNR of data obtained at the first spatial encoding.

In some embodiments, determining to collect the additional data comprises determining to collect additional data corresponding to one or more k-space coordinates not sampled by the first pulse sequence.

In some embodiments, determining parameters for the second pulse sequence comprises: determining an initial set of parameters for one or more RF pulses and/or gradient waveforms to be generated as part of the second pulse sequence using the parameters of the first pulse sequence used to obtain the first subset of the data; and adjusting the initial set of parameters to compensate for a presence of eddy currents during operation of the MRI system. In some embodiments, adjusting the initial set of parameters to compensate for the presence of eddy currents during operation of the MRI system comprises correcting a gradient waveform generated in accordance with the second pulse sequence and associated with a target gradient field using a non-linear function of a characteristic of the gradient waveform to obtain a corrected gradient waveform; and operating the MRI system in accordance with the second pulse sequence comprises operating the MRI system in accordance with the corrected gradient waveform to generate the target gradient field.

In some embodiments, determining parameters for the second pulse sequence comprises: determining an initial set of parameters for one or more RF pulses and/or gradient waveforms to be generated at part of the second pulse sequence using the parameters of the first pulse sequence used to obtain the first subset of the data; and adjusting the initial set of parameters to compensate for effects of hysteresis in the MRI system. Adjusting the initial set of parameters to compensate for effects of hysteresis in the MRI system may comprise determining a corrected pulse sequence to control the at least one gradient coil based on the first pulses sequence and a hysteresis model of induced magnetization of the MRI system caused by operation of the at least one gradient coil; and operating the MRI system in accordance with the second pulse sequence may comprise controlling, using the corrected pulse sequence, the at least one gradient coil to generate one or more gradient pulses for imaging a patient.

In some embodiments, the determining to collect additional data to augment and/or replace the at least some of the obtained data may be repeated at least once during the obtaining the data in accordance with the first pulse sequence.

In some embodiments, the method further comprises: (1) prior to completing the obtaining the additional data in accordance with the second pulse sequence, determining to collect additional data to augment and/or replace at least some of the obtained data in accordance with the second pulse sequence; (2) determining a third pulse sequence to use for obtaining the additional data to augment and/or replace the at least some of the obtained data in accordance with the second pulse sequence; and (3) after completing the obtaining the additional data in accordance with the second pulse sequence, obtaining the additional data by operating the MRI system in accordance with the third pulse sequence.

In some embodiments, the determining to collect additional data to augment and/or replace at least one of the obtained data is based at least in part on a difference between a time spent obtaining the data in accordance with the first pulse sequence and an allotted time for performing imaging.

According to some aspects of the technology described herein, there is provided a magnetic resonance imaging (MRI) system for imaging a subject, the MRI system comprising: a plurality of magnetics components including at least one gradient coil and at least one radio-frequency (RF) coil; and at least one controller configured to: (1) obtain data for generating at least one magnetic resonance image of the subject by operating the MRI system in accordance with a first pulse sequence; (2) prior to completing the obtaining the data in accordance with the first pulse sequence, determine to collect additional data to augment and/or replace at least some of the obtained data; (3) determine a second pulse sequence to use for obtaining the additional data; and (4) after completing the obtaining the data in accordance with the first pulse sequence, obtaining the additional data by operating the MRI system in accordance with the second pulse sequence.

The aspects and embodiments described above, as well as additional aspects and embodiments, are described further below. These aspects and/or embodiments may be used individually, all together, or in any combination, as the technology is not limited in this respect.

(2) Example Magnetic Resonance Imaging Systems

FIG. 1A illustrates exemplary components of an MRI system which may be used to perform at least some or all of the techniques for dynamically extending imaging described herein. In the illustrative example of FIG. 1A, MRI system 100 comprises computing device 104, controller 106, pulse sequences repository 108, power management system 110, and magnetics components 120. It should be appreciated that MRI system 100 is illustrative and that an MRI system may have one or more other components of any suitable type in addition to or instead of the components illustrated in FIG. 1A. However, an MRI system will generally include these high-level components, though the implementation of these components for a particular MRI system may differ. Examples of MRI systems that may be used in accordance with some embodiments of the technology described herein are described in U.S. Pat. No. 10,627,464 filed Jun. 30, 2017 and titled "Low-Field Magnetic Resonance Imaging Methods and Apparatus," which is incorporated by reference herein in its entirety.

As illustrated in FIG. 1A, magnetics components 120 comprise $B_0$ magnets 122, shims 124, radio frequency (RF) transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be one or more permanent magnets, one or more electromagnets, one or more superconducting magnets, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T or within a range from 50 mT to 0.1 T.

For example, in some embodiments, $B_0$ magnets 122 may include a first and second $B_0$ magnet, each of the first and second $B_0$ magnet including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by $B_0$ magnets 122 and/or shims 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards), for example, as described in U.S. Pat. No. 9,817,093 filed Sep. 4, 2015 and titled "LOW FIELD MAGNETIC RESONANCE IMAGING METHODS AND APPARATUS," which is incorporated by reference herein in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1A, RF transmit and receive coils 126 comprises one or more transmit coils that may be used to generate RF pulses to induce an oscillating magnetic field $B_1$. The transmit coil(s) may be configured to generate any suitable types of RF pulses.

Power management system 110 includes electronics to provide operating power to one or more components of the MRI system 100. For example, power management system 110 may include one or more power supplies, energy storage devices, gradient power components, transmit coil components, and/or any other suitable power electronics needed to provide suitable operating power to energize and operate components of MRI system 100. As illustrated in FIG. 1A, power management system 110 comprises power supply system 112, power component(s) 114, transmit/receive circuitry 116, and thermal management components 118 (e.g., cryogenic cooling equipment for superconducting magnets, water cooling equipment for electromagnets).

Power supply system 112 includes electronics to provide operating power to magnetic components 120 of the MRI system 100. The electronics of power supply system 112 may provide, for example, operating power to one or more gradient coils (e.g., gradient coils 128) to generate one or more gradient magnetic fields to provide spatial encoding of the MR signals. Additionally, the electronics of power supply system 112 may provide operating power to one or more RF coils (e.g., RF transmit and receive coils 126) to generate and/or receive one or more RF signals from the subject. For example, power supply system 112 may include a power supply configured to provide power from mains electricity to the MRI system and/or an energy storage device. The power supply may, in some embodiments, be an AC-to-DC power supply configured to convert AC power from mains electricity into DC power for use by the MRI system. The energy storage device may, in some embodiments, be any one of a battery, a capacitor, an ultracapacitor, a flywheel, or any other suitable energy storage apparatus that may bidirectionally receive (e.g., store) power from mains electricity and supply power to the MRI system. Additionally, power supply system 112 may include additional power electronics encompassing components including, but not limited to, power converters, switches, buses, drivers, and any other suitable electronics for supplying the MRI system with power.

Amplifiers(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shims (e.g., shims 124). In some embodiments the shim may be implemented using permanent magnets, electromagnetics (e.g., a coil), and/or a combination thereof. Transmit/receive circuitry 116 may be used to select whether RF transmit coils or RF receive coils are being operated.

As illustrated in FIG. 1A, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.).

A pulse sequence generally describes the order and timing in which transmit/receive coils and gradient coils operate to prepare the magnetization of a subject and acquire resulting MR data. For example, a pulse sequence may indicate an order and duration of transmit pulses, gradient pulses, and acquisition times during which the receive coils acquire MR data.

A pulse sequence may be organized into a series of periods. For example, a pulse sequence may comprise a pre-programmed number of pulse repetition periods, and applying a pulse sequence may comprise operating the MRI system in accordance with parameters of the pulse sequence for the pre-programmed number of pulse repetition periods. In each period, the pulse sequence may include parameters for generating RF pulses (e.g., parameters identifying transmit duration, waveform, amplitude, phase, etc.), parameters for generating gradient fields (e.g., parameters identifying transmit duration, waveform, amplitude, phase, etc.), timing parameters governing when RF and/or gradient pulses are generated and/or when the receive coil(s) are configured to detect MR signals generated by the subject, etc. In some embodiments, a pulse sequence may include parameters specifying one or more navigator RF pulses, as described herein.

Examples of pulse sequences include zero echo time (ZTE) pulse sequences, balance steady-state free precession (bSSFP) pulse sequences, gradient echo pulse sequences, inversion recovery pulse sequences, diffusion weighted imaging (DWI) pulse sequences, spin echo pulse sequences including conventional spin echo (CSE) pulse sequences, fast spin echo (FSE) pulse sequences, turbo spin echo (TSE) pulse sequences and/or any multi-spin echo pulse sequences such a diffusion weighted spin echo pulse sequences, inversion recovery spin echo pulse sequences, arterial spin labeling pulse sequences, Overhauser imaging pulse sequences, etc., aspects of which are described in U.S. Pat. No. 10,591, 561 filed Nov. 11, 2015 and titled "PULSE SEQUENCES FOR LOW FIELD MAGNETIC RESONANCE," which is incorporated by reference herein in its entirety.

As illustrated in FIG. 1A, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect.

The system 100 may further comprise one or more external sensors 162. As is further described herein, the one or more external sensors may assist in detecting one or more error sources (e.g., motion, noise) which degrade image quality. Information obtained by the one or more external sensors 162 may be used to determine whether to extend imaging according to process 300. The controller 106 may be configured to receive information from the one or more external sensors, in some embodiments. In some embodiments, the controller 106 of the system 100 may be configured to control operations of the one or more external sensors 162. Examples of the one or more external sensors for obtaining information on one or more error sources are further described herein.

(3) Systems and Methods for Determining Whether to Extend Imaging

As described herein, the inventors have developed systems and methods for dynamically extending imaging performed by a magnetic resonance imaging system. For example, in some instances it may be desired to extend imaging performed by an MRI system in order to augment data acquired by the MRI system and/or to replace data acquired by the MRI system that is of poor quality.

In particular, one or more error sources, such as motion (of the patient being imaged, MRI system components, and/or peripheral components), magnetic field drift, changing hysteresis, uncompensated eddy currents and/or shim, and noise may affect the data acquired by the MRI system resulting in artifacts appearing in the MR image generated from the impacted MR data. In some instances, the degradation in image quality due to the one or more error sources may be small, such that the degradation may be suitably corrected by post-processing the data, discarding the impacted data, or taking no action. However, in some instances, where additional time for performing imaging is available and/or the image degradation is particularly severe, it may be desired to augment and/or replace acquired MR data by extending imaging performed by the MRI system.

Figure 1B:
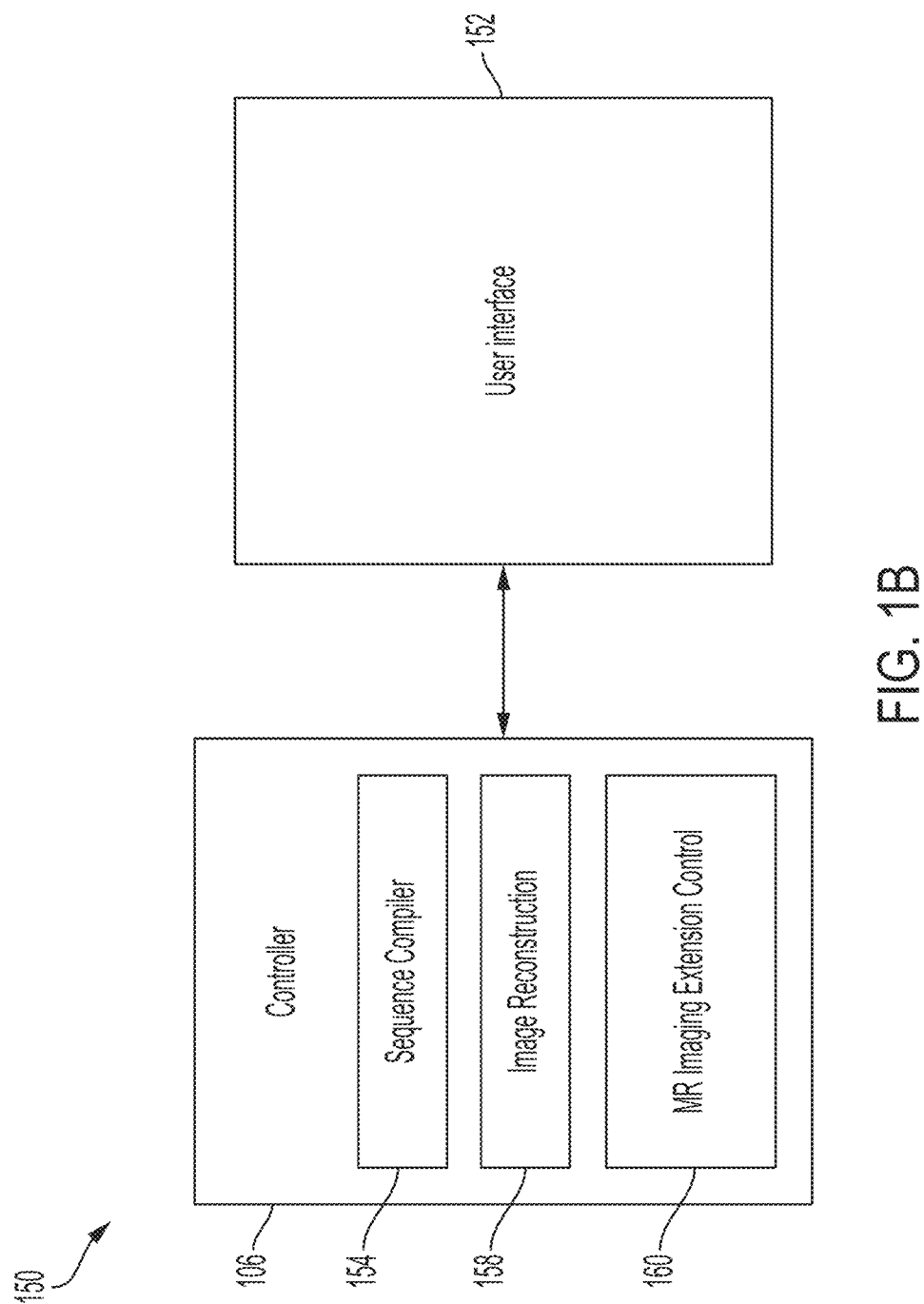
FIG. 1B illustrates an example system for determining to extend magnetic resonance imaging, in accordance with some embodiments of the technology described herein.

FIG. 1B illustrates an example system 150 for determining to extend magnetic resonance imaging, in accordance with some embodiments of the technology described herein. For example, the system 150 may be used to perform all or part of the example process 300 described herein, for example, with respect to FIG. 3. In some embodiments, the system 150 forms a portion of an MRI system, for example, MRI system 100 described herein. In some embodiments, the system 150 is external to an MRI system but communicates with the MRI system to perform the example process 300 described herein.

As shown in FIG. 1B, the example system 150 comprises user interface 152. User interface 152 may allow a user to view aspects of the dynamic rescanning techniques described herein and/or to provide input on performing such techniques, for example, via display on computing device 104 shown in FIG. 1A. For example, the user interface 152 may allow a user to select a type of imaging to be performed by the MRI system (e.g., diffusion-weighted imaging, etc.). In some embodiments, the user interface 152 may display, via a display in communication with the user interface 152, images generated from MR data acquired by the MRI system. User interface 152 may allow a user to initiate imaging by the MRI system.

Controller 106 may be configured to control aspects of the example system 150, for example to perform at least a portion of the example process 300. In some embodiments, the controller 106 may be configured to control one or more operations of the MRI system, for example, as described with respect to FIG. 1A.

The controller 106 may be implemented using software, hardware, or a combination thereof. For example, the controller 106 may comprise software code executable on any suitable processor or collection of processors. When implemented in hardware, the controller 106 may comprise a processor, circuitry implemented via one or more Field Programmable Gate Arrays, and/or an application-specific integrated circuit, etc.

The controller 106 may be configured to perform one or more functions. For example, controller 106 comprises sequence compiler 154. Sequence compiler 154 may be configured to store information relating to an MRI system state, as described herein, in which MR data was obtained. For example, the sequence compiler 154 may store information relating to corrections applied to correct for eddy currents and/or hysteresis, as is further described herein. In some embodiments, the MRI system state information stored by the sequence compiler 154 may be used in obtaining additional MR data to ensure that the MRI system state is maintained while obtaining the additional MR data. For example, information regarding the MRI system state may represent an effect on the MRI system at a point in time of any RF pulses and/or gradient fields which were generated by the MRI system prior to the identified point in time. The information regarding the MRI state may include information that captures the effect of previously generated gradient magnetic fields on the system such as hysteresis (e.g., induced magnetization of components of the MRI system) and/or eddy currents (e.g., induced currents in MRI system components due to rapidly changing gradient magnetic fields which result in generation of auxiliary magnetic fields). A smooth transition between the data obtained in accordance with the first pulse sequence and the data obtained in accordance with the second pulse sequence may be ensured using the information stored by the sequence compiler 154.

Controller 106 further comprises image reconstruction component 158. Image reconstruction component 158 may be configured to generate an image based on MR data acquired by the MRI system. In some embodiments, an MR image generated by the image reconstruction component 158 may be evaluated, for one or more sources of error, for example, to determine whether to extend imaging performed by the MRI system, as described herein.

For example, image reconstruction may be performed by applying different computational tools to perform different tasks of a processing pipeline. The processing pipeline may involve performing various pre-processing, reconstruction, and post-processing tasks on MR data acquired by the MRI system. The pre-processing tasks may include sorting and filtering of data, correcting the data for motion, and suppressing RF artifacts (e.g., external RF interference generated by any device(s) external to the MRI system, internal RF interference generated by any component(s) of the MRI system outside of its imaging region, and noise generated by the receive circuitry of the MRI system) in the data. After pre-processing, the pipeline may involve reconstructing MR images from the pre-processed data using linear methods (e.g., gridding, principle components analysis (PCA), sensitivity encoding (SENSE), generalized autocalibrating partial parallel acquisition (GRAPPA) or non-linear methods (e.g., compressed sensing, deep learning)). Next, the resulting images may be post processed to perform retrospective motion correction, artifact removal, denoising, intensity correction, and/or image enhancement. In some embodiments, one or more tasks of the processing pipeline may be performed by a unified deep-learning processing pipeline for processing MRI data to generate MR images of patients. The unified deep-learning processing pipeline may include the use of multiple neural networks to perform different pipeline tasks such as removing artifacts (e.g., interference, noise, corrupted read-out lines) from input MR data, reconstructing images from the input MR data, combining MR images generated from data collected by different RF coils, aligning sets of MR images to one another to compensate for patient motion, combining aligned sets of MR images to increase the image signal to noise (SNR), correcting for inhomogeneous intensity variations. Additional aspects of such image reconstruction techniques are described in U.S. Pat. Pub. No.: 2020/0033431, titled "Deep Learning Techniques For Magnetic Resonance Image Reconstruction", filed on Jul. 29, 2019, which is incorporated by reference herein in its entirety.

Controller 106 further comprises MR imaging extension control 160. In particular, information (e.g., measure(s) of patient motion, SNR, amount of k-space sampled, measures of image quality, etc.) obtained from image reconstruction component 158, the one or more external sensors 162, and/or one or more other sources, as described herein, may be used to determine whether to extend imaging performed by the MRI system. MR imaging extension control 160 may determine whether to extend imaging based on the information (e.g., according to process 300 described herein). In some embodiments, the controller 106 (e.g., MR imaging extension control 160 and/or sequence compiler 154) may determine how to acquire the additional data (e.g., by determining a pulse sequence to apply, which may include determining parameters of the pulse sequence such as waveform, amplitude, duration, phase, etc.), and controller 106 may be configured to cause the MRI system to operate in accordance with the determined pulse sequence to obtain the additional data.

After acquiring MR data, which may include extending imaging to acquire additional MR data one or more times, a final image may be generated. In some embodiments, the image reconstruction component 158 may correct for one or more sources of error in the MR data by augmenting and/or replacing poor quality MR data with the additional data obtained by the extended imaging. The final image 164 therefore may be of high quality, substantially devoid of any artifacts resulting from the one or more error sources impacting the MR data acquisition. The final image 164 may be used in various contexts, for example, in treating and/or diagnosing a patient and/or in a research setting.

Figure 2A:
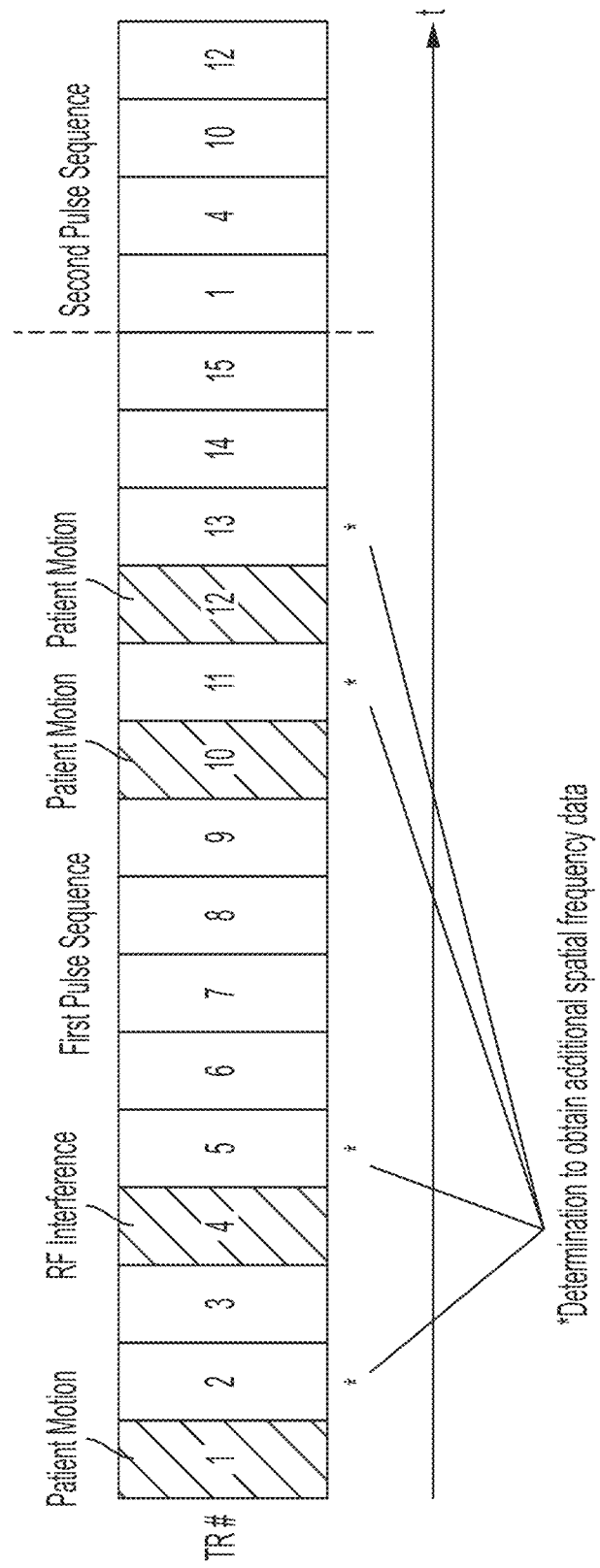
FIGS. 2A-2C illustrate schematic diagrams of example pulse sequences during initial acquisition and extended acquisition, in accordance with some embodiments of the technology described herein.
Figure 2B:
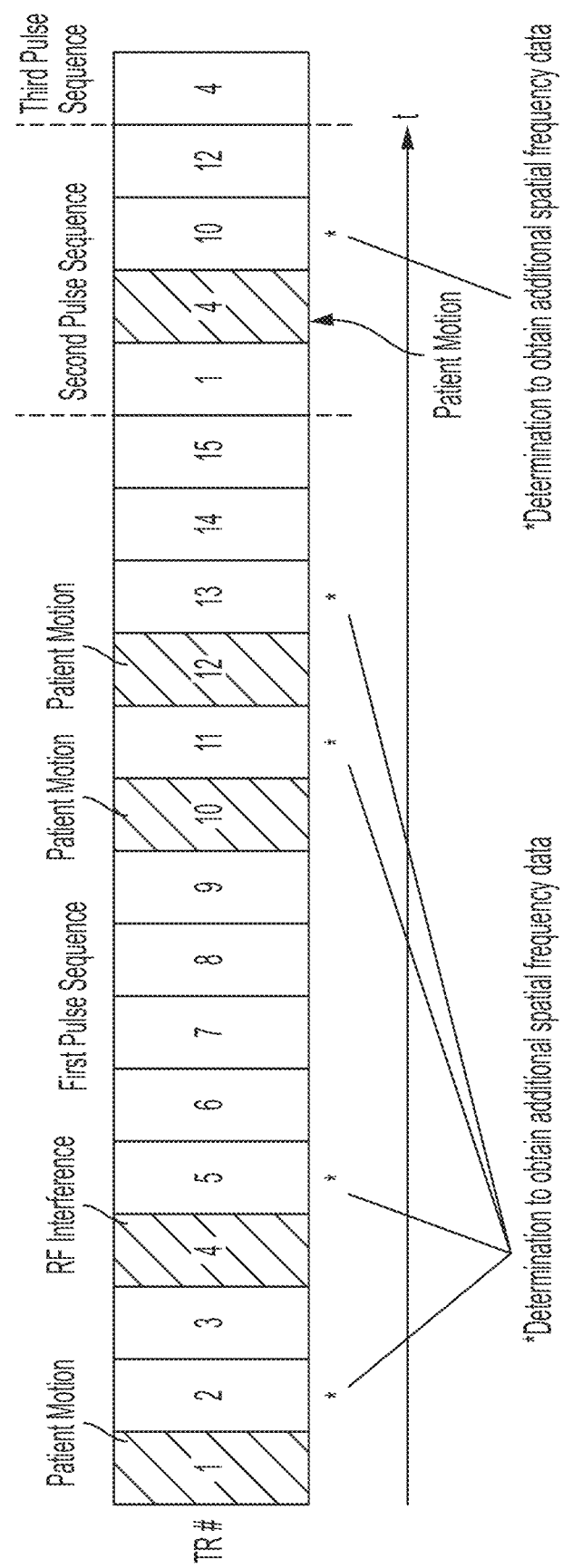
Figure 2C:
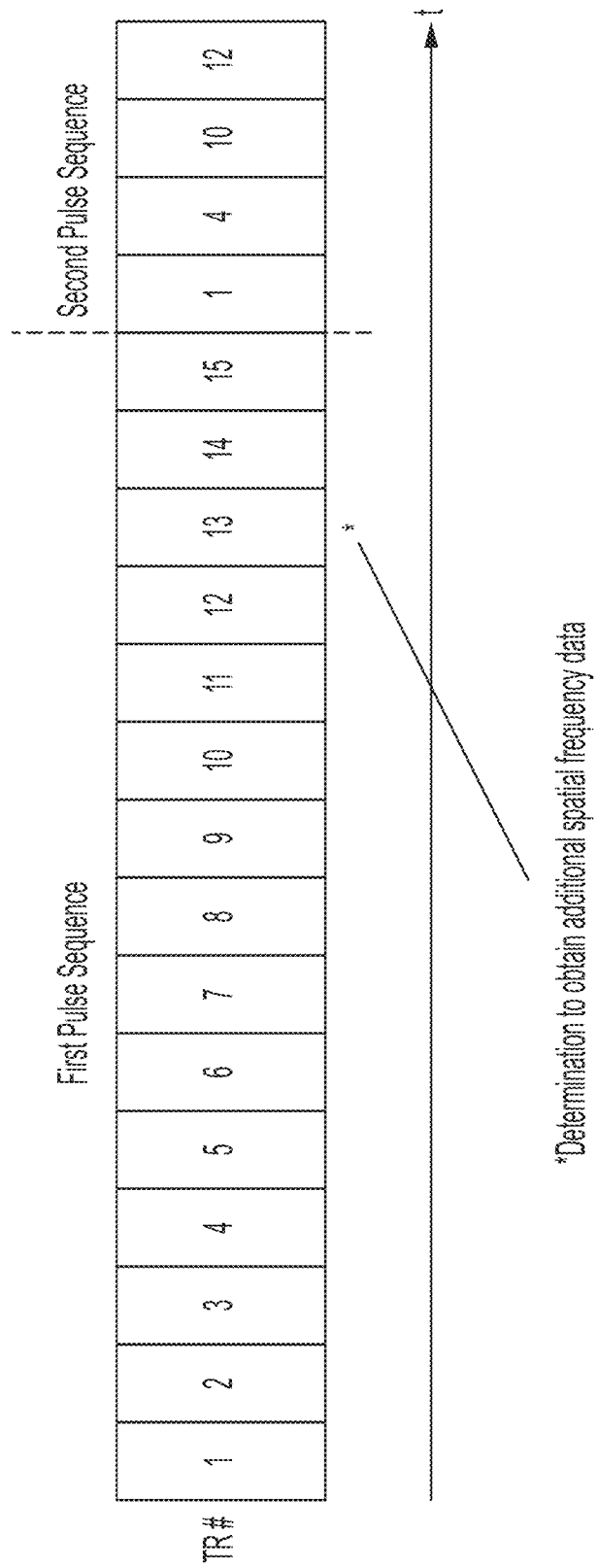

FIGS. 2A-2C illustrate schematic diagrams of example pulse sequences during initial acquisition and extended acquisition, in accordance with some embodiments of the technology described herein. For example, a number of repetition periods (TRs) have been marked for reacquisition (e.g., according to the techniques described herein), as shown by the shaded gray boxes in FIG. 2A. The determination to acquire data for the marked TRs may be based on the detection of one or more error sources that occur during acquisition of the data according to a first pulse sequence and/or detection of artifact(s) caused by the one or more error sources, as described herein. For example, FIG. 2A indicates that patient motion has impacted the quality of the data obtained during TRs 1, 10, and 12, and RF interference has impacted the quality of the data obtained during TR 4.

In some embodiments, the determination to extend imaging may be made dynamically. For example, the determination to extend imaging to acquire additional data to augment and/or replace the impacted data obtained at TR 1 may be made subsequent to TR 1 but before the end of the first pulse sequence and the determination may be made using the impacted data obtained at TR 1. Likewise, the determination to extend imaging to acquire additional data to augment and/or replace the impacted data obtained at TRs 4, 10, and 12 may be made before the end of the first pulse sequence using the impacted data obtained at TRs 4, 10, and 12.

As shown in FIG. 2A, a second pulse sequence may be applied to obtain additional data for the impacted TRs. The second pulse sequence may be concatenated at the end of the first pulse sequence such that a continuous repetition of TRs is performed.

FIG. 2B is another schematic diagram of example pulse sequences during initial acquisition and extended acquisition. FIG. 2B illustrates an extension of FIG. 2A where the data obtained in accordance with the second pulse sequence to replace and/or augment the data obtained in accordance with the first pulse sequence was impacted by an error source (e.g., patient motion). A determination to further extend imaging by applying a third pulse sequence to obtain further additional data to augment and/or replace the data obtained in accordance with the second pulse sequence at TR 4 may be made prior to the completion of the second pulse sequence. In some embodiments, the determination may be made by the MRI system as shown in FIGS. 1A and 1B, for example, using controller 106. As such, imaging may be dynamically extended repeatedly until stopping conditions (e.g., an allotted time, acquisition of an acceptable data set, for example) are met.

FIG. 2C is another schematic diagram of example pulse sequences during initial acquisition and extended acquisition. In particular, FIG. 2C illustrates that no error sources have impacted the data obtained in accordance with the first pulse sequence. However, a determination may still be made, subsequent to completion of the first pulse sequence, to extend imaging by obtaining additional data in accordance with a second pulse sequence. In particular, it may be determined that additional time in an allotted time to perform imaging is available, and that it would be advantageous to use the additional time to obtain additional data to augment the data obtained in accordance with the first pulse sequence (e.g., to further increase an SNR of the acquired data and/or to sample additional locations in k-space not previously sampled).

Figure 3:
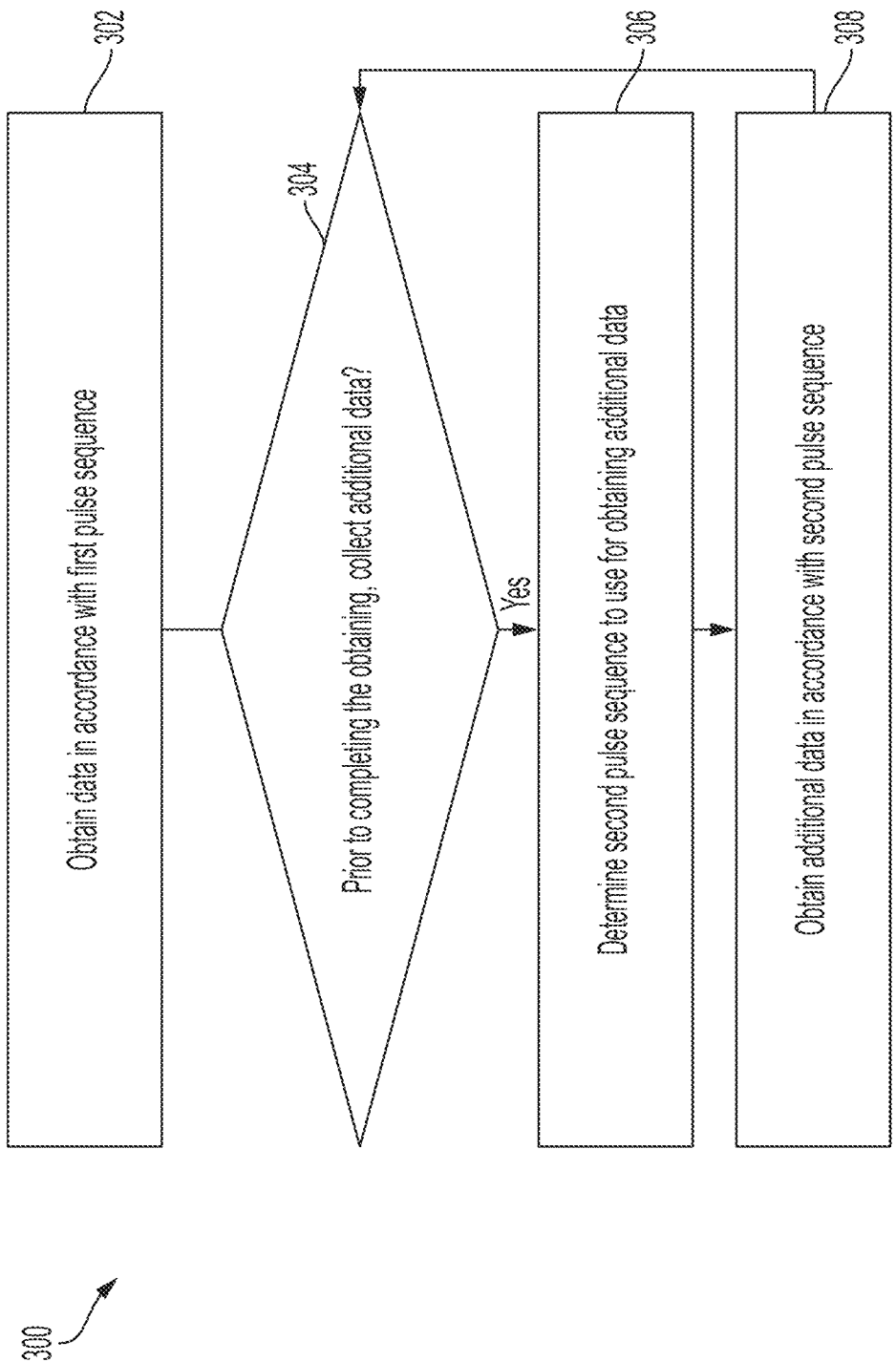
FIG. 3 illustrates an example process for determining to extend magnetic resonance imaging, in accordance with some embodiments of the technology described herein.

FIG. 3 illustrates an example process 300 for determining whether to extend magnetic resonance imaging, in accordance with some embodiments of the technology described herein. The process 300 shown in FIG. 3A begins at act 302, where data (e.g., spatial frequency data) is obtained by an MRI system in accordance with a first pulse sequence. The MRI system may comprise at least one radio-frequency (RF) coil, as described herein (e.g., with respect to FIG. 1A and the accompanying description provided herein), for obtaining the data in accordance with the first pulse sequence by transmitting one or more RF pulses in accordance with the first pulse sequence with the at least one RF coil and receiving, with the at least one RF coil, MR signals emitted by a patient being imaged in response to the one or more RF pulses transmitted in accordance with the first pulse sequence. The first pulse sequence may be any suitable MR pulse sequence, examples of which are provided herein.

At act 304, it may be determined whether additional data (e.g., spatial frequency data) should be obtained. In particular, the determination at act 304 may be made dynamically, prior to completing obtaining the data in accordance with the first pulse sequence at act 302. As described herein, in some embodiments, it may be desired to obtain additional MR data in order to replace poor quality data obtained in accordance with a first pulse sequence. In some embodiments, it may be desired to augment data obtained in accordance with the first pulse sequence to increase SNR and/or to sample additional locations in k-space not sampled in accordance with the first pulse sequence. Aspects of the technology relating to dynamically determining whether the collect additional data are further described herein, for example, in subsection (4)(iv) techniques for determining whether to extend imaging based.

For example, act 304 may include: (i) analyzing data collected by MRI system (e.g., MR signals responsive to RF navigator pulses, data obtained by one or more sensors coupled to the MRI system, reconstructed data, and/or the MR data itself) to determine that a patient moved during acquisition of MR data accordance with a first pulse sequence; and (ii) determining that the motion was to a degree that makes the collected data unusable (or undesirable or suboptimal to use) for forming MRI images. In response to determining that the motion rendered the MR data unusable, the MRI system may determine that the data collected during the patient motion should be replaced and a determination may be made to collect additional data to replace it.

As another example, in some embodiments, act 304 may include: (i) analyzing data collected by MRI system (e.g., data obtained by one or more sensors coupled to the MRI system, reconstructed data, and/or the MR data itself) to determine that interference was present in an environment of the MRI system during acquisition of MR data obtained in accordance with the first pulse sequence; and (ii) determining that the interference was to a degree that makes the collected data unusable (or undesirable or suboptimal to use) for forming MRI images. In response to determining that the interference rendered the MR data unusable, the MRI system may determine that the data collected during the interference should be replaced and a determination may be made to collect additional data to replace it.

As yet another example, in some embodiments, act 304 may include: (i) analyzing data collected by MRI system (e.g., data obtained by one or more sensors coupled to the MRI system, reconstructed data, and/or the MR data itself) and/or a remaining time allotted for performing imaging to determine that the MR data obtained in accordance with the first pulse sequence may be augmented; and (ii) determining that additional MR data should be acquired to augment the MR data obtained in accordance with the first pulse sequence (e.g., to increase SNR, sample additional locations in k-space, etc.).

If, at act 304, it is determined that no additional data is to be collected, the process 300 may, subsequent completing obtaining the data in accordance with the first pulse sequence, end. If, at act 304, it is determined to collect additional data, the process 300 may proceed though the yes branch to act 306.

At act 306, a second pulse sequence for use in obtaining the additional data is determined. For example, the second pulse sequence may be designed to maintain a steady state of MR signal as described herein (e.g., in section 5 describing techniques for determining how to acquire additional MR data). The second pulse sequence may be designed to obtain data at particular locations in k-space (e.g., locations for which data has not yet been obtained, locations at which previously acquired data is of poor quality and should be augmented or replaced). In some embodiments, the second pulse sequence may be designed to correct for artifacts caused by one or more error sources (e.g., motion, noise) which caused the data obtained in accordance with the first pulse sequence to be of poor quality, as described herein. Determining the second pulse sequence to use for obtaining the additional data at act 306 may be performed dynamically, for example, prior to completing obtaining the data in accordance with the first pulse sequence at act 302.

Subsequently, the process 300 may proceed to act 308 where the additional data is obtained in accordance with the second pulse sequence determined at act 308. For example, the at least one RF coil of the MRI system may be used to transmit one or more RF pulses in accordance with the second pulse sequence determined at act 308, and the at least one RF coil may receive MR signals emitted from the patient in response to the one or more RF pulses transmitted in accordance with the second pulse sequence. Pulses of the of the second pulse sequence may be concatenated at the end of the first pulse sequence. As described herein, the additional data obtained at act 308 in accordance with the second pulse sequence may be used to augment and/or replace the data obtained in accordance with the first pulse sequence at act 302.

The process 300 may proceed from act 308 back to act 304, where, prior to completing the obtaining of the additional data in accordance with the second pulse sequence at act 308, it is determined whether to collect additional spatial frequency. Thus, the process 300 may be repeated until it is determined that no additional data need be collected and the process 300 may end.

Thus, process 300 provides a method for dynamically determining to extend imaging performed by an MRI system. The determination to extend imaging in process 300 at act 304, and further the determination of how to perform the extended imaging at act 306, is performed dynamically, in particular, prior to completing obtaining the data obtained in accordance with the first pulse sequence. However, the additional data obtained in accordance with the second pulse sequence is obtained subsequent to completing the obtaining of the data obtained in accordance with the first pulse sequence, and the one or more pulses of the second pulse sequence are concatenated at the end of the first pulse sequence. The inventors have recognized that such techniques of dynamically determining whether and how to extend imaging while performing imaging is beneficial, as the determining whether and how to collect additional data may be performed at the same time that the data is obtained in accordance with the first pulse sequence. In particular, when performing MRI, hydrogen protons of the subject being imaged excite and relax over a time period (defined as the repetition time, or "TR"). The repetition times of the first pulse sequence may be utilized efficiently to also perform acts 304-306 of determining whether and how to obtain the additional data.

(4) Techniques for Detecting One or More Error Sources

As described herein, the techniques for extending imaging performed by an MRI system may include determining whether to obtain additional data in accordance with a supplemental pulse sequence. In some embodiments, the determination of whether to extend imaging may be based at least in part on an amount of time left in a time allotted for performing the imaging. In some embodiments, as described herein, the determination may be based on an impact of one or more error sources on the MR data. For example, one or more error sources, such as motion (of the patient being imaged, one or more components of the MRI system, one or more peripheral components, etc.), magnetic field drift, changing hysteresis, uncompensated eddy currents and/or shim, and/or noise, may degrade image quality such that acquiring additional MR data to augment and/or replace the degraded data would be beneficial. Thus, characterizing the one or more error sources which may degrade image quality may be performed and such characterizations may be used to determine whether to extend imaging.

Various techniques for detecting and/or characterizing the one or more error sources impacting MR image quality are described herein. The techniques described herein may be used in any combination. The techniques for detecting and/or characterizing the one or more error sources may be performed dynamically, for example, during acquisition of data according to a first pulse sequence.

(i) Techniques for Detecting Motion

As described herein, motion of the patient, MRI system components, and/or one or more components external to the MRI system may be sources of error which create artifacts in MR images. Example techniques for detecting and characterizing motion are described below.

(a) Navigator Pulses

In some embodiments, the one or more error sources are detected and characterized using MR signals obtained from one or more navigator pulses transmitted by the MRI system. Navigators are additional RF pulses used to obtain information about movement of the patient being imaged.

Figure 4A:
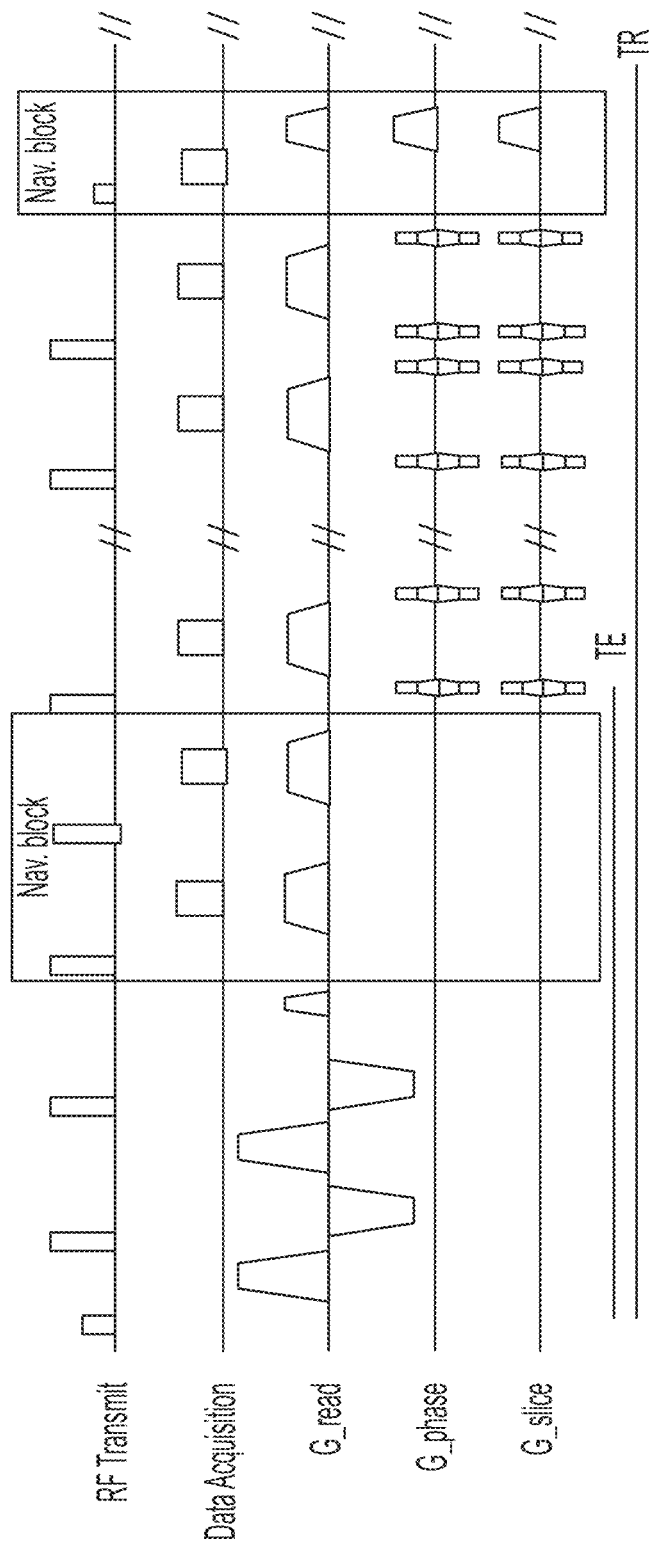
FIGS. 4A-4B illustrates an example pulse sequence with a spatially encoded navigator pulse, in accordance with some embodiments of the technology described herein.
Figure 4B:
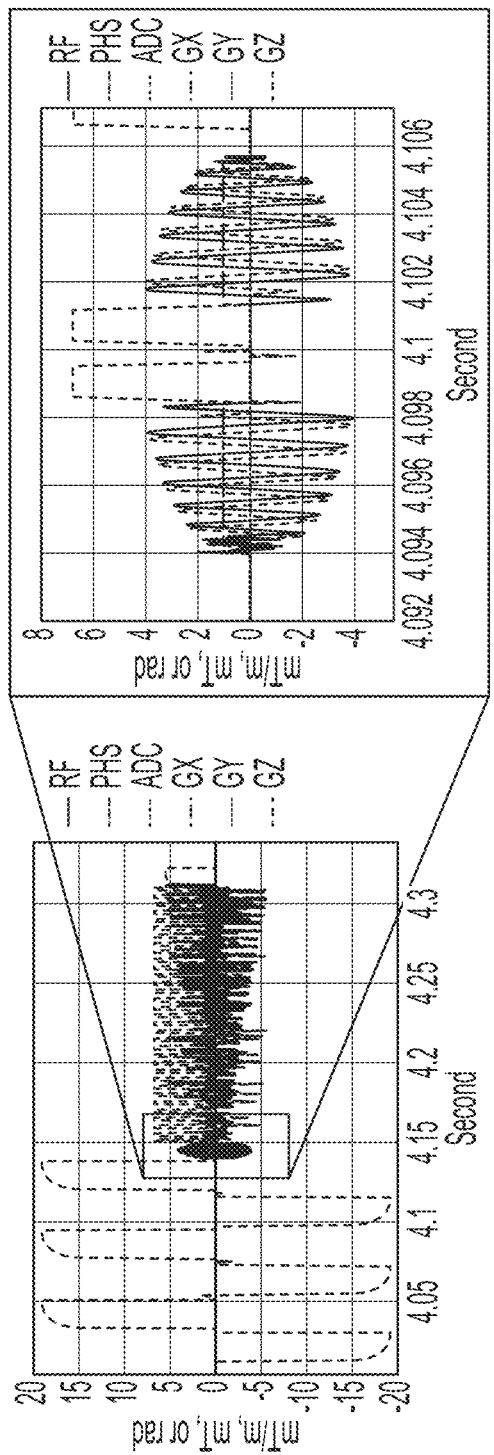

FIGS. 4A-4B illustrates an example pulse sequence with a spatially encoded navigator pulse, in accordance with some embodiments of the technology described herein. In particular, FIG. 4A illustrates navigator pulses in one repetition time (TR) of a spin echo-based diffusion-weighted imaging (DWI) sequence. The DWI pulses are shown in FIG. 4A on the read-out gradient axis labeled "G_read."

As shown in FIG. 4A, the first navigator block (outlined in FIG. 4A in a box) has two spin echoes, acquired with a one-dimensional readout gradient. In some embodiments, the navigator pulse comprises only a single navigator pulse acquisition. In other embodiments, such as the embodiment shown in FIG. 4A, multiple navigator pulses are used which may be beneficial where separate processing of odd- and even-numbered echoes is to be performed. As shown in FIG. 4A, the two navigator echo pulses outlined in the first are acquired just after the DWI pulses are transmitted and just before acquisition of MR data. FIG. 4A further illustrates a second navigator block (outlined in a box in FIG. 4A), at the end of the echo-train. The second navigator block may be used for frequency drift correction.

FIG. 4B illustrates another example of a DWI sequence with a spatially encoded navigator. The navigator pulses shown in FIG. 4B are transmitted subsequent to transmitting the RF pulses in accordance with the DWI sequence for obtaining MR data for image reconstruction. MR signals received in response to the navigator pulses may be reconstructed into a low resolution image that can be used to track movement, as described herein.

As described herein, the MR signal obtained in response to the one or more navigator pulses provide an indicator of patient motion. For example, MR signals obtained in response to the one or more navigator pulses may indicate whether a patient has translated or rotated, in what direction, and by what amount. In particular, measuring the phase shift of MR signal obtained in response to the one or more navigator allows for monitoring of movement of patient anatomy being imaged. Thus, navigator pulses may be interleaved with RF pulses transmitted by the at least one RF coil for obtaining MR data to obtain information regarding how the patient has moved during imaging. The motion information obtained using the navigator pulses may be used, as described herein, to determine whether to extend imaging to augment and/or replace MR data impacted by the patient motion. Any suitable type of navigator pulses may be used, for example spin echo (SE) pulses, gradient echo (GRE) pulses, etc.

(b) Sensors for Detecting Motion

In some embodiments, one or more sensors may be implemented for measuring motion of the patient being imaged, components of the MRI system, and/or one or more peripheral components, each of which may cause degradation in the quality of images generated from acquired MR data. The one or more sensors for measuring motion may be coupled to the patient, the MRI system, and/or the one or more peripheral components. The one or more sensors may obtain information relating to motion (e.g., a magnitude and/or direction of translation and/or rotation), which may be used to determine whether to extend imaging performed by the MRI system.

Figure 5A:
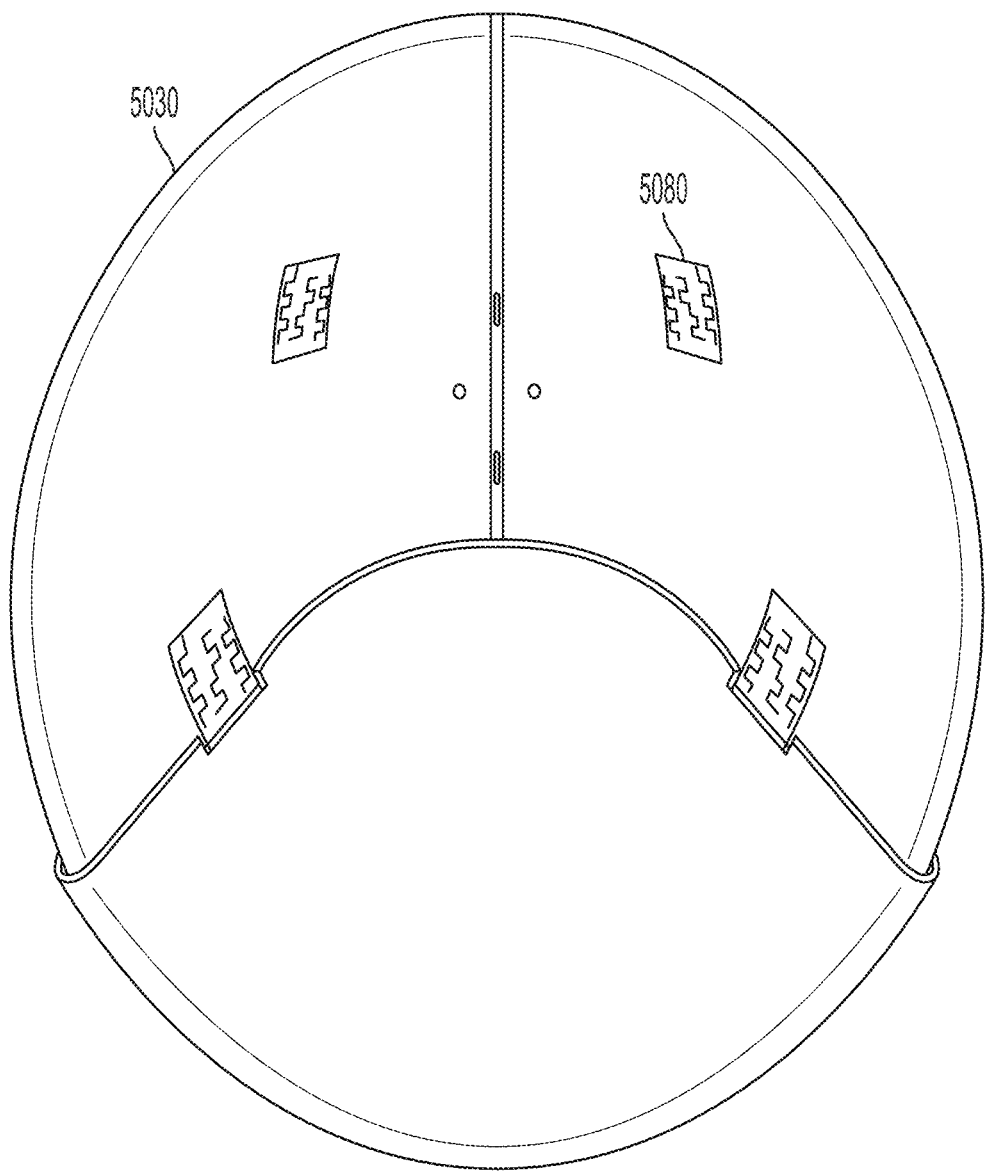
FIG. 5A illustrates example sensors for detecting motion, in accordance with some embodiments of the technology described herein.

FIG. 5A illustrates example sensors for detecting motion, in accordance with some embodiments of the technology described herein. As shown in FIG. 5A, a sensor 5080 is provided for measuring motion. As shown in FIG. 5A, the sensor 5080 is coupled to a MR helmet 5030 configured for performing MR imaging of a patient's head. Thus, sensor 5080 may detect motion of the MR helmet 5030. In some embodiments, the MR helmet 5030 is coupled to the MRI system, and thus the sensor 5080 may detect motion of the MRI system by proxy of detecting motion of the MR helmet 5030. In some embodiments, the MR helmet 5030 is coupled to the patient and may move independently of the MRI system, and thus the sensor 5080 may detect motion of the patient by proxy of detecting motion of the MR helmet 5030.

In some embodiments, the one or more sensors for measuring motion may comprise one or more inertial sensors, such as an accelerometer and/or a gyroscope. In some embodiments, the one or more sensors for measuring motion comprise pressure sensors. In some embodiments, the one or more sensors for measuring motion comprise one or more optical sensors (e.g., one or more cameras).

In some embodiments, the one or more sensors for measuring motion comprises at least one RF sensor. For example, the inventors have appreciated that the resonant frequency of a sensor (e.g., an RF sensor such as an RF antenna) may change when in the presence of a subject (e.g., a patient) due to the parasitic capacitance between the sensor and the subject. For example, the resonant frequency of the sensor may decrease as the distance between the sensor and the patient decreases. Accordingly, the position and/or motion of a patient during an MR imaging procedure may be detected using at least one sensor configured to capacitively couple with the patient.

In some embodiments, detecting patient position and/or motion using an RF sensor may be performed by monitoring a reflected power at a set frequency from the sensor rather than detecting a change in the sensor's resonant frequency. The set frequency may be determined based on the resonant frequency of the sensor and set to a frequency such that the sensitivity of the sensor is increased (e.g., to a frequency such that the reflection curve has a maximum slope).

Thus, in some embodiments, the MRI system may include at least one sensor (e.g., one or more RF antennas, for example, one or more loop antennas, bowtie antennas, dipole antennas, or any other RF antenna configured to resonate at a desired resonant frequency) configured to be capacitively coupled to the patient during MR imaging. In some embodiments, the RF sensor may have a resonant frequency between 100 MHz and 250 MHz. In some embodiments, while the patient remains positioned within the MRI system, the device may be configured to drive the at least one sensor with at least one radio frequency (RF) signal and measure a reflected signal value from the at least one sensor. The reflected signal value may be characteristic of a signal reflected by the at least one sensor in response to the at least one RF signal. For example, the reflected signal value may be a voltage. In some embodiments, a reflection coefficient calculated from the reflected signal value that is below a threshold reflection coefficient value may be indicative of a patient's motion. The threshold reflection coefficient value may be determined based on a previously measured reflection coefficient value (e.g., the threshold reflection coefficient value may be a previously measured reflection coefficient value plus and/or minus a percentage value indicative of noise). Accordingly, the reflected signal value and/or reflection coefficient obtained by using the device may be used to determine whether the patient has moved.

In some embodiments, a calibration procedure may be used to increase sensitivity of a sensor to the parasitic capacitance of the patient. The sensor may be most sensitive to parasitic capacitance when driven by at least one RF signal having a frequency different from the sensor's resonant frequency (e.g., within 5% of the sensor's resonant frequency). In some embodiments, calibrating the sensor may include driving the sensor with a calibration RF signal whose frequency varies over time, identifying a resonant frequency of the sensor, and setting a driving frequency to be used for driving the sensor to be either the sensor's resonant frequency or within 5% of its identified resonant frequency. As described herein, the driving frequency may be set to a frequency such that the sensitivity of the sensor is increased (e.g., to a frequency such that the reflection curve has a maximum slope).

(ii) Techniques for Detecting Interference

As described herein, the MRI system may be susceptible to multiple error sources during imaging which result in artifacts in MR data, such as external RF interference generated by one or more devices external to the MRI system, internal RF interference generated by one or more components of the MRI system outside of its imaging region, and/or noise generated by the receive circuitry of the MRI system. Low-field MRI systems deployed outside of shielded rooms (e.g., Faraday cages) in various environments (e.g., emergency room, an ICU, an ambulance, a doctor's office, etc.) and in the presence of various other devices (e.g., medical equipment, smart phones, televisions, etc.), may be particularly susceptible to RF interference. As described herein, RF interference may also include internal RF interference generated by one or more components of the MRI system located outside of its imaging region (e.g., a power supply, gradient coils, gradient coil amplifiers, RF amplifiers, etc.).

Thus, in some embodiments, one or more sensors may be used for measuring interference (e.g., noise) generated by one or more components of the MRI system and/or one or more components external to the MRI system, each of which may cause degradation in the quality of images generated from acquired MR data. The measure of noise obtained by the one or more sensors described herein may be used to determine whether to extend imaging performed by the MRI system, according to the techniques described herein.

Figure 5B:
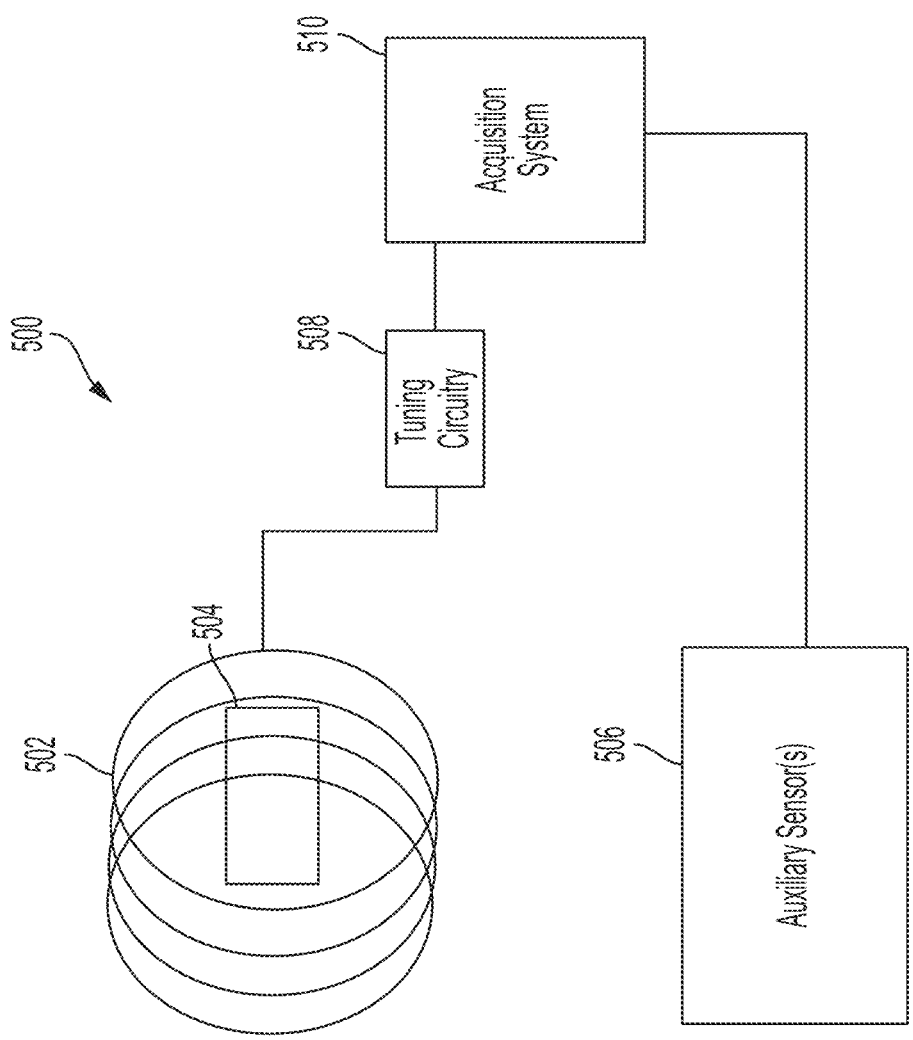
FIG. 5B illustrates exemplary components of an MRI system used for detecting noise, in accordance with some embodiments of the technology described herein.

For example, FIG. 5B illustrates exemplary components of an MRI system used for detecting noise, in accordance with some embodiments of the technology described herein. For example, transmit/receive system 500 may form at least part of the transmit/receive equipment the MRI system described herein. Transmit/receive system 500 is configured to detect MR signals emitted from excited atoms of a subject 504 being imaged, and to characterize noise in the environment.

As shown in FIG. 5B, transmit/receive system 500 comprises a primary RF receive coil 502 configured to measure MR signals emitted by the subject 504 in response to an excitation pulse sequence. The excitation pulse sequence may be produced by primary RF receive coil 502 and/or by one or more other transmit RF coils arranged proximate subject 504 and configured to produce suitable MR pulse sequences when operated. Primary receive coil 502 may be a single coil or may be a plurality of coils, which, in the latter case, may be used to perform parallel MRI. Tuning circuitry 508 facilitates operation of primary receive coil 502 and signals detected by RF coil(s) 502 are provided to acquisition system 510, which may amplify the detected signals, digitize the detected signals, and/or perform any other suitable type of processing.

Transmit/receive system 500 also includes auxiliary sensor(s) 506, which may include any number or type of sensor(s) configured to detect or otherwise measure noise sources in the environment and/or environmental noise produced by the MRI system itself. The noise measured by auxiliary sensor(s) 506 may be characterized and used determine whether to extend imaging, according to the techniques described herein. After acquisition system 510 processes the signals detected by RF coil(s) 502 and auxiliary sensor(s) 506, acquisition system 510 may provide the processed signals to one or more other components of the MRI system for further processing (e.g., for use in forming one or more MR images of subject 504).

In some embodiments, auxiliary sensor(s) 506 may include one or more auxiliary coils 506 configured to measure noise from one or more noise sources in the environment in which the MRI system is operating. In some instances, the auxiliary RF coil(s) 506 may be constructed to be substantially more sensitive to ambient noise than to any noise generated by the coil itself. For example, the auxiliary RF coil 506 may have a sufficiently large aperture and/or a number of turns such that the auxiliary coil is more sensitive to noise from the environment than to noise generated by the auxiliary coil itself. In some embodiments, auxiliary RF coil(s) 506 may have a larger aperture and/or a greater number of turns than primary RF coil(s) 502. However, auxiliary RF coil(s) 506 may be the same as primary RF coil in this respect and/or may differ from primary RF coil(s) 502 in other respects, as the techniques described herein are not limited to any particular choice of coils. For example, in some embodiments, an auxiliary sensor of a different type is used in place of an RF coil type sensor, as discussed in further detail below.

In the illustrative embodiment of FIG. 5B, auxiliary RF coil(s) 506 is/are located a distance apart from primary RF coil 502. The distance may be selected such that auxiliary coil(s) 506 is/are sufficiently far away from the sample 504 to avoid sensing MR signals emitted by the sample during imaging, but otherwise arranged as close as possible to the primary RF coil 502 so that auxiliary coil(s) 506 detect noise similar to the noise detected by primary coil(s) 502. In this manner, the noise from one or more noise sources measured by auxiliary coil(s) 506 may be representative of the noise detected by primary coil(s) 502. It should be appreciated that auxiliary coil(s) 506 need not be RF coils, but may be any type of sensor capable of detecting or measuring noise in the environment that may impact the performance of the MRI system, as the techniques described herein are not limited for use with any particular type of sensor.

According to some embodiments, auxiliary sensor(s) 506 may include one or more auxiliary sensors 506 configure to measure noise by coupling sensor(s) to one or more components of the MRI system. For example, auxiliary sensors 506 may include one or more sensors coupled to one or more components of the MRI system or otherwise arranged to detect noise produced by the MRI system. As discussed above, power cables are frequently a source of noise that can have a negative impact on the operation of the MRI system and, in particular, may produce noise that is detected by the one or more primary coils. According to some embodiments, auxiliary sensor(s) 506 include one or more sensors coupled (e.g., capacitively or inductively) to one or more power cables of the system to detect noise produced therefrom.

Additional aspects of the one or more sensors for measuring noise are further described in herein are described in U.S. Pat. No. 9,547,057 filed Sep. 4, 2015 and titled "NOISE SUPPRESSION METHODS AND APPARATUS," which is incorporated by reference herein in its entirety.

(iii) Techniques Using Reconstructed Data

In some embodiments, the MR data obtained by the MRI system may itself be used to detect and/or characterize the one or more sources of error. For example, in some embodiments, the MR data may be viewed to determine whether the one or more sources of error are likely to have impacted the data acquisition by the MRI system. For example, in some embodiments, one or more MR images may be generated from MR data obtained by the MRI system. The generated images may be analyzed (e.g., by controller 106 of the MRI system, by an external controller, by a user, etc.) to determine whether the one or more sources of error are likely to have impacted the data acquisition by the MRI system. The MR data and/or the generated MR image may reveal that some of the acquired data is inconsistent with other portions of the MR data, indicating the presence of an artifact caused by the one or more error sources. In some embodiments, the MR data and/or the generated data may illustrate spikes and/or exceedances in the MR data which may indicate the presence of an artifact caused by the one or more error sources. Thus, the detection and/or characterization of the one or more error sources via the data may be used to determine whether to extend imaging.

(iv) Techniques for Determining Whether to Extend Imaging

Subsequent to detecting and/or characterizing the one or more error sources as described herein, the information obtained may be used to determine whether to extend imaging (e.g., by determining to obtain, with the MRI system, additional data in accordance with a supplemental pulse sequence). For example, as described herein, in some instances MR image quality may be degraded to an extent that reacquisition of MR data to augment and/or replace the impacted data with the MR data acquired by extending imaging is warranted. In some embodiments, the locations in k-space at which the poor quality data was acquired are stored in system memory, and extending imaging may comprise obtaining MR data at the stored locations in k-space to obtain MR data to replace and/or augment the poor quality data.

Thus, the information characterizing the one or more error sources may indicate locations in k-space at which additional data should be acquired. As described herein, some sources of error may be sufficiently small such that the artifacts resulting from the sources of error may be addressed by post processing, discarding a small amount of data, and/or taking no further action, while other sources of error are of considerable size such that extending imaging to acquire additional data is warranted. To determine when extending imaging is warranted, the information character-izing the one or more error sources obtained according to the techniques described herein may be considered.

The information characterizing the error source may comprise an empirical measure of the error source (e.g., noise, patient motion, etc.). In some embodiments, the measure of the error source may be compared to a threshold (e.g., by determining whether the measure is greater than the threshold, greater than or equal to the threshold, etc.). When the measure of the error source exceeds the threshold, it may be determined to acquire additional data for the locations in k-space at which the measure of the error source exceeds the threshold.

For example, as described herein, MR signals obtained in response to transmitting one or more navigator pulses may be used to characterize patient motion. In some embodiments, the magnitude of the MR signals obtained in response to transmitting the one or more navigator pulses at locations in k-space may be compared to a threshold magnitude value to determine whether the magnitude of the MR signals exceed the threshold. Additional data at the locations in k-space where the MR signals obtained in response to the one or more navigator pulses may be acquired during extended imaging. In some embodiments, all locations in k-space for which MR signal magnitude exceeds the threshold may be resampled and replaced. In some embodiments, only a portion of the locations in k-space for which MR signal magnitude exceeds the threshold may be resampled and replaced (e.g., the locations in k-space for which MR signal magnitude is the highest, for example, in the top 20% percent).

In some embodiments, determining whether to collect additional data may be based on a deviation in magnitude and/or phase of an MR signal obtained at a location in k-space in response to one or more navigator pulses from an average MR signal magnitude and/or phase. For example, locations in k-space for which MR signal magnitude and/or phase deviate from an average MR signal magnitude and/or phase by an amount that exceeds a threshold may be resampled and replaced with the newly acquired imaging data. In some embodiments, all locations in k-space for which MR signal deviation in magnitude and/or phase exceeds a threshold may be resampled and replaced. In some embodiments, only a portion of the locations in k-space for which MR signal deviation in magnitude and/or phase exceeds the threshold may be resampled and replaced (e.g., the locations in k-space for which MR signal deviation is the highest, for example, in the top 20%).

In some embodiments, a system may determine to obtain additional data when there is additional time available for performing imaging. For example, in some embodiments, there may be provided a time allotted for image acquisition. Obtaining data in accordance with a first pulse sequence may consume only a portion of the allotted time, such that additional time for obtaining additional data is available, and the system may determine, in such instances, to acquire additional data based on the determination that additional time remains in the allotted time for imaging.

In some embodiments, additional data may be acquired until data for all locations in k-space are acquired. As such, the determination of whether to obtain additional data may be based on whether there are any locations in k-space yet to be sampled. In some embodiments, additional data may be acquired until a target signal-to-noise ratio is reached. As such, the determination of whether to obtain additional data may be based on whether a current measure of SNR is greater than or equal to a target value. In some embodiments, additional data may be acquired to augment MR data previously acquired until background artifacts in an image generated based on the MR data are suppressed below a threshold. As such, the determination of whether to obtain additional data may be based on whether background artifacts in an image generated based on acquired MR data are less than a threshold value.

As described herein, a limited amount of time may be allotted for performing imaging. In some embodiments, determining whether to acquire additional data to augment and/or replace MR data impacted by the one or more error sources may involve prioritizing obtaining additional data for locations in k-space which have been most negatively impacted by the one or more error sources. As described herein, in some embodiments, determining whether to acquire additional data for locations in k-space impacted by the one or more error sources may comprise comparing a measure of the error source (e.g., noise, motion) to a threshold. In some embodiments, the threshold may be determined based on measures of the error source already acquired. For example, the threshold may be selected based on a histogram of previously acquired error measures (e.g., by selecting a threshold that exceeds a percentage of the previously acquired error measures). The threshold may be dynamically adapted with each new measure of the one or more error sources at the locations in k-space which are acquired.

(5) Techniques for Determining How to Acquire Additional Data

As described herein, subsequent to determining additional data should be acquired, a supplemental pulse sequence for obtaining the additional data may be determined. Thus, according to some embodiments of the technology described herein, there are provided techniques for determining how to acquire the additional data.

For example, the further scanning may be performed in any order. In some embodiments, it may be desirable to begin the second pulse sequence at locations near the central region of k-space, and subsequently sample locations farther from the central region of k-space.

For example, the additional data may be obtained according to a generated sampling path. Any suitable sampling path may be used, including, for example a Cartesian sampling path or a non-Cartesian sampling path (e.g., spiral, radial, Lissajous, radial Lissajous). Additional aspects of example sample paths are described in U.S. patent application Ser. No. 17/078,660, titled "ARTEFACT REDUCTION IN MAGNETIC RESONANCE IMAGING", filed on Oct. 23, 2020, which is hereby incorporated by reference in its entirety.

In some embodiments, for example, where data obtained in accordance with a first pulse sequence was impacted by patient motion, the data obtained in accordance with a second pulse sequence at the impacted locations in k-space may compensate for the motion by rotating imaging gradients, for example, to match the patient's new orientation relative to the MRI system and/or by applying phase offsets and/or phase shifts to compensate for translational motion of the patient.

For example, MR data collected during MR imaging in accordance with the first pulse sequence may be used to determine a transformation corresponding to the subject's motion and, in turn, the transformation may be used to adjust the pulse sequence used for subsequent imaging of the subject. In some embodiments, the pulse sequence may be adjusted by changing the gradient waveforms to be generated by the gradient coils of the MRI system and/or changing the transmit/receive frequency and/or phase of the RF coil(s) of the MRI system.

Accordingly, in some embodiments the techniques described herein for dynamically extending imaging performed by an MRI system may include (1) obtaining data by operating the MRI system in accordance with a first pulse sequence; (2) determining a transformation (e.g., a rigid transformation comprising a rotation and/or a translation) using a first image obtained using the data and a second image obtained using the second data (3) determining a second pulse sequence to be applied by the MRI system using the determined transformation; and (4) obtaining additional data in accordance with the second pulse sequence.

In some embodiments, the additional data may data for k-space coordinates that were going to be sampled by the first pulse sequence, but these samples will now be collected in the motion-corrected coordinate system by using the second pulse sequence. Additionally or alternatively, the additional data may include collecting data at new k-space coordinates, as aspects of the technology described herein are not limited in this respect.

In some embodiments, the first pulse sequence comprises a gradient waveform, correcting the first pulse sequence comprises determining a corrected gradient waveform from the gradient waveform by using the determined transformation, and obtaining the additional data in accordance with the second pulse sequence comprises operating the MRI system in accordance with the corrected gradient waveform. In some embodiments, the transformation comprises a rotation and determining the corrected gradient waveform comprises applying the rotation to the gradient waveform. In some embodiments, the transformation comprises a translation, and correcting the pulse sequence comprises changing transmit frequency of the at least one RF coil and/or receive phase of the at least one RF coil.

In some embodiments, the data obtained in accordance with the first pulse sequence may comprise a first subset of data obtained when the subject was in a first position during imaging, and a second subset of data obtained when the subject was in a second position during imaging. In some embodiments, data collected during the subject's motion may be discarded.

In some embodiments, the first and second subsets of data may be identified based on additional information indicating a time or times when the subject was moving. The additional information may be obtained by one or more sensors configured to detect and/or track motion of a subject being imaged.

Subsequent to detecting subject, a transformation indicative of the motion of the subject between the first and second positions is determined. In some embodiments, the transformation may be determined from the first and second subsets of data. For example, in some embodiments, the transformation may be determined by: (1) generating first and second images (e.g., $x_1$, $x_2$) the first subset of data (e.g., ($k_1$, $b_1$)) and second subset of data (e.g., ($k_2$, $b_2$)), respectively; and (2) estimating the transformation T from the first and second images. The first and second images may be generated from the first and second spatial subsets of data using any suitable reconstruction technique(s).

The transformation may be estimated from the first and second images in any suitable way. For example, in some embodiments, the transformation may be a rigid transformation comprising a rotation R matrix and a translation vector t such that:

$$x_2 = Rx_1 + t,$$

and estimating the transformation may comprise estimating the values of R and t (e.g., assuming 6 degrees of freedom) from the data in the images $x_1$ and $x_2$ so that the above equation is satisfies as closely as possible under a suitable choice of metric (correlation, mean-squared error, l1-norm, a regularized norm, etc.). It should be appreciated, however, that in some embodiments the transformation need not be limited to a rigid transformation and may be any other suitable type of transformation, as aspects of the technology described herein are not limited in this respect.

The second pulse sequence used for extended imaging of the subject may be determined and corrected for the subject's motion by using the determined transformation. For example, in some embodiments, the pulse sequence comprises a gradient waveform, and correcting the pulse sequence comprises determining a corrected gradient waveform. In some embodiments, the transformation comprises a rotation and determining the corrected gradient waveform comprises applying the rotation to the gradient waveform. In some embodiments, the transformation comprises a translation, and wherein correcting the pulse sequence comprises changing transmit frequency of the at least one RF coil and/or receive phase of the at least one RF coil. Aspects of such calculations are described in J. Maclaren, M. Herbst, O. Speck, and M. Zaitsev, "Prospective motion correction in brain imaging: A review", Magnetic Resonance in Medicine, Volume 69, Issue 23, Mar. 1, 2013, pp. 621-636, which is incorporated by reference herein in its entirety.

The inventors have recognized that in obtaining the additional MR data, it is beneficial to store information regarding MRI system state throughout MR data acquisition which may be used to ensure a smooth transition between obtaining the additional data and obtaining data at an end of the first pulse sequence. For example, as described herein, information regarding the MRI system state may represent an effect on the MRI system at a point in time of any RF pulses and/or gradient fields which were generated by the MRI system prior to the identified point in time. The information regarding the MRI state may include information that captures the effect of previously generated gradient magnetic fields on the system such as hysteresis (e.g., induced magnetization of components of the MRI system) and/or eddy currents (e.g., induced currents in MRI system components due to rapidly changing gradient magnetic fields which result in generation of auxiliary magnetic fields). A smooth transition between the data obtained in accordance with the first pulse sequence and the data obtained in accordance with the second pulse sequence may be ensured using the information regarding the MRI system state stored by the MRI system.

For example, the MRI system state may include information that may be used to compute a correction for hysteresis, and a continuous imaging state may be maintained during transition from the first pulse sequence to the second pulse sequence. Example techniques for correcting for hysteresis are described in U.S. patent application Ser. No. 16/684,976, titled "CORRECTING FOR HYSTERESIS IN MAGNETIC RESONANCE IMAGING", filed on Nov. 15, 2019, which is hereby incorporated by reference in its entirety.

In particular, hysteresis effects, due to induced magnetization in ferromagnetic materials, reduce the SNR and/or cause imaging errors in low-field MRI systems. Many components of MRI systems and associated surroundings are formed from or include ferromagnetic materials that are susceptible to magnetization induced by one or more electromagnets of the MRI system. When the ferromagnetic material of the various components is magnetized, the resulting magnetic fields affects the magnetic field in an imaging region of the MRI system, including the $B_0$ field, linear gradient fields and higher order terms. In high-field MRI systems, magnetic fields created by induced magnetization of ferromagnetic materials of various components of the system may be ignored due to the small magnitude of these fields relative to the high-field strength of the magnets of the MRI system. However, hysteresis effects should be addressed in low-field MRI systems to increase the SNR.

For example, as described herein, the MRI system includes one or more gradient coils used to gradient magnetic fields in the imaging region of the low-field MRI system. A gradient pulse sequence is used to control the magnetic field generated by the gradient coil such that the magnetic field in the imaging region varies as a function of time. The dynamic magnetic field generated by the gradient coil(s) induces a magnetization in the permanent magnet plates, the ferromagnetic yoke, and other components of the MRI system made of ferromagnetic material. The induced magnetization is a hysteresis effect that creates a magnetic field in the imaging region in addition to the magnetic field created by the gradient coil(s). Consequently, the actual magnetic field present in the imaging region is no longer precisely controlled by the gradient coil(s), but is instead a sum of the magnetic field generated by the gradient coil(s) and the magnetic field generated by the induced magnetization (and the magnetic field created by other magnets of the MRI system, such as a $B_0$ magnet). Not having precise control over the magnetic field is in the imaging region reduces SNR and the quality of resulting MRI images.

Hysteresis effects induced in an MRI system may be measured in advance of using the MRI system to image a patient. In turn, the measurements may be used to create a hysteresis model of the hysteresis effects, which may be used to compensate for these effects during subsequent imaging. For example, the hysteresis model may be used to modify a target pulse sequence to determine a corrected pulse sequence to control the electromagnets (e.g., the gradient coils) of the MRI system to create the desired magnetic field strength in the imaging region of the MRI system. Because the hysteresis effects are taken into account when determining the pulse sequence used to control the electromagnets, in some embodiments, the desired magnetic field strength may reflect contributions of the induced magnetization of the MRI system and the magnetic field created by the electromagnetics controlled by the corrected pulse sequence.

The degree of induced magnetization in the MRI system may be captured using a model of hysteresis (e.g., a Presaich model). The model may be used to perform a correction to the MRI system. The model may be calibrated (e.g., by estimating parameters of the model using obtained calibration data) prior to using the MRI system.

Accordingly, in some embodiments, the MRI system state includes a hysteresis correction, and the MRI system is configured to adjust a set of parameters of the first pulse sequence to compensate for the effects of hysteresis. Adjusting the set of parameters of the first pulse sequence may comprise determining a first correction for a first TR in the first pulse sequence and determining a first gradient waveform to be generated using the at least one gradient coil of the MRI system using the first correction. It may be determined, for example, according to the techniques described herein, that additional data for the first TR should be acquired to augment and/or replace the MR data acquired in accordance with the first pulse sequence for the first TR. Accordingly, the MRI system may be configured to determine a second correction for the first TR in a second pulse sequence and determine a second gradient waveform to be generated using the at least one gradient coil of the MRI system using the second correction. The second correction, and thus the second gradient waveform, may be different from the first correction.

In some embodiments, the MRI system state includes compensation for eddy currents. Eddy current compensation and artifact mitigation can be achieved in part by correcting gradient fields generated by the MRI system. Gradient field eddy current compensation is commonly used in MRI systems with unshielded, partially shielded or imperfectly shielded gradient coils to correct for the response of metallic or other conductive structures around the gradient coils of the MRI system. One application that strongly relies on eddy current correction is diffusion weighted imaging (DWI), where strong diffusion gradients are applied just before smaller imaging gradients are applied. Additional applications that can benefit from eddy current correction is diffusion weighted steady-state free precession (DW-SSFP) imaging and fast spin echo (FSE) imaging.

Conventional eddy current correction methods assume a linear response of the MRI system to gradient field pulses, and thus apply a single correction filter to pre-emphasize the entire gradient waveform (e.g., by performing a multi-exponential convolution) and use the resulting pre-emphasized waveform to generate the target gradient field. Such conventional techniques therefore apply the single correction filter to the entire gradient waveform without taking into account any characteristics of the gradient waveform (e.g., its amplitude, slew rate, shape, etc.).

Conventional eddy current correction methods model the relationship between gradient fields and resultant eddy currents as a linear time invariant system. Improved eddy correction methods may model the relationship between gradient fields and resultant eddy currents as a time-varying system, and implement eddy current correction to counteract the effect of this time-varying systems on gradient fields generated from gradient waveforms by applying a non-linear scaling function (that is non-linear in the characteristic(s) of the gradient waveforms) to the gradient waveforms.

Thus, in some embodiments, imaging using the MRI system may comprise methods for mitigating and/or compensating for the effect of gradient field-induced eddy currents using a nonlinear approach in which: (1) a gradient waveform is corrected using a non-linear function of a characteristic of the gradient waveform to obtain a corrected gradient waveform; and (2) using the corrected gradient waveform to generate the target gradient field. Without such a correction, the generated gradient field (e.g., generating using the uncorrected gradient waveform) would result in a gradient field that differs from the target gradient field due to the presence of eddy currents.

As described herein, in some embodiments, the additional data may be obtained to replace poor quality MR data. In some embodiments, the additional data may instead by used to augment the previously acquired data. For example, the additional data may be acquired at locations in k-space previously acquired but may now be acquired in a manner which avoids and/or suppresses noise. In some embodiments, the additional data may be performed at a same spatial encoding as previously acquired data, and the additional data may be averaged with the previously acquired data to increase SNR. In some embodiments, the additional data may be acquired at locations in k-space not previously sampled to ensure a complete sampling of all locations in a region of k-space.

(6) Results

Figure 6C:
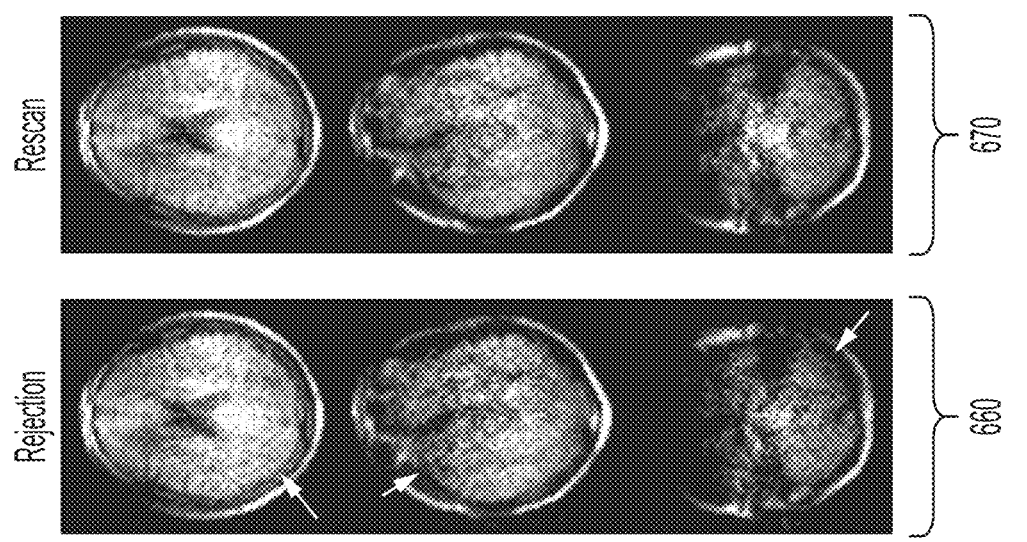

FIGS. 6A-6C illustrate example images acquired with and without the dynamic rescanning techniques described herein, in accordance with some embodiments of the technology described herein. For example, FIG. 5A illustrates MR images acquired from a phantom during periods of imaging with (1) no motion shown in images 610, (2) motion without rescanning shown in images 620, and (3) motion with rescanning to replace MR data impacted by the motion shown in images 630. As shown in images 630, signal loss and motion artifacts resulting from the motion are reduced as a result of the rescanning techniques.

FIG. 6B illustrates MR images acquired from a DWI scan of a brain. Images 640 shown in FIG. 6B illustrate MR data acquired without performing the rescanning techniques described herein while images 650 illustrate MR data acquired having performed the rescanning techniques described herein. Like images 630 shown in FIG. 6A, images 650 shown in FIG. 6B illustrate reduced signal loss and motion artifacts as a result of performing the rescanning techniques described herein.

FIG. 6C illustrates MR data acquired from a DWI scan of a brain during slight motion. Images 660 illustrate MR images generated from MR data acquired during the motion where motion compensation is performed by discarding poor quality data. Images 670 illustrate MR images generated from MR data acquired during the motion where motion compensation is performed by acquiring additional data to replace location in k-space where MR data was degraded by the motion. The arrows in images 660 illustrate areas where signal loss and motion artifacts are reduced by performing the rescanning techniques.

As shown in FIGS. 6A-6C, extending imaging to obtain additional data to augment and/or replace poor quality MR data improves the quality of MR images generated from the MR data. The improved MR images can help improve diagnosis and/or treatment of patients based on the acquired MR images. The rescanning techniques described herein result in improved error correction than conventional methods. For example, the rescanning techniques do not simply discard poor quality data resulting in gaps in the MR data set, but rather acquires additional MR data to augment or replace the poor quality MR data. Further, the techniques described herein extend imaging without interrupting the steady repetition of TRs during imaging, decreasing the risk of more dramatic patient motion which may otherwise occur by stopping and restarting imaging or by extending a length of imaging performed in accordance with a first pulse sequence. The rescanning techniques described herein are further capable of addressing image artifacts which cannot be fully addressed through post-processing of the MR data alone.

The techniques described herein may be applied to any type of pulse sequence. In some embodiments, the techniques described herein for extending imaging may be applied to DWI pulse sequences, as described herein. DWI uses the diffusion of water molecules to generate contrast in MR images. DWI pulse sequences use strong diffusion gradients in certain directions in order to detect particles that diffuse in those directions. Because the mobility of water is driven by thermal agitation and is highly dependent on its cellular environment, the hypothesis behind DWI is that findings may indicate (early) pathologic change. Diffusion imaging is particularly useful in applications such as, for example, tumor characterization and detecting cerebral ischemia. At low magnetic fields, the SNR of a DWI sequence is particularly low. Though repeated acquisitions may be averaged in order to increase the SNR for this specific imaging application, this leads to longer acquisition times (e.g., >5 minutes) as compared to standard high-field protocols. Increased acquisition times lead to the introduction of motion artifacts into the images and, because DWI sequences use large diffusion gradients, the effects of patient motion during imaging are exacerbated.

The techniques described herein may be used in two-dimensional imaging applications. The techniques described herein may be used with three-dimensional imaging applications.

The techniques described herein may further be combined with one or more other techniques for correcting one or more error sources in MR data acquisition, as described herein. The techniques described herein may be combined with techniques for avoiding and/or suppressing the one or more error sources (e.g., noise), in some embodiments.

(7) Example Computing Systems

Figure 7:
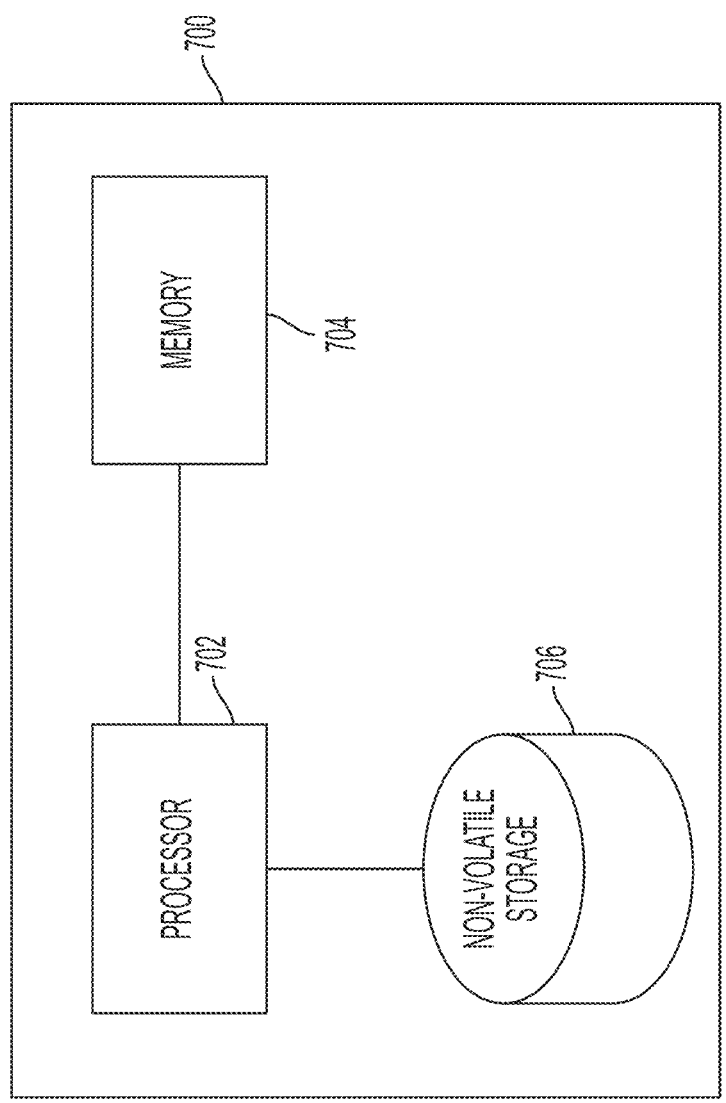
FIG. 7 illustrates a block diagram of an example computer system, in accordance with some embodiments of the technology described herein.

FIG. 7 shows a block diagram of an example computer system 700 that may be used to implement embodiments of the technology described herein. The computing device 700 may include one or more computer hardware processors 702 and non-transitory computer-readable storage media (e.g., memory 704 and one or more non-volatile storage devices 706). The processor(s) 702 may control writing data to and reading data from (1) the memory 704; and (2) the non-volatile storage device(s) 706. To perform any of the functionality described herein, the processor(s) 702 may execute one or more processor-executable instructions stored in one or more non-transitory computer-readable storage media (e.g., the memory 704), which may serve as non-transitory computer-readable storage media storing processor-executable instructions for execution by the processor(s) 702.

(8) Alternatives and Scope

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

The above-described embodiments of the present technology can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as a controller that controls the above-described function. A controller can be implemented in numerous ways, such as with dedicated hardware, or with general purpose hardware (e.g., one or more processor) that is programmed using microcode or software to perform the functions recited above, and may be implemented in a combination of ways when the controller corresponds to multiple components of a system.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "substantially", "approximately", and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. A method for imaging a subject using a magnetic resonance imaging (MRI) system, the MRI system comprising a plurality of magnetics components including at least one gradient coil and at least one radio-frequency (RF) coil, the method comprising:
    obtaining data for generating at least one magnetic resonance image of the subject by operating the MRI system in accordance with a first pulse sequence;
    prior to completing the obtaining the data in accordance with the first pulse sequence, determining to collect additional data to augment and/or replace at least some of the obtained data;
    determining a second pulse sequence to use for obtaining the additional data, wherein determining the second pulse sequence comprises determining parameters for the second pulse sequence based on a state of the MRI system subsequent to operating the MRI system in accordance with the first pulse sequence; and
    after completing the obtaining the data in accordance with the first pulse sequence, obtaining the additional data by operating the MRI system in accordance with the second pulse sequence.

2. The method of claim 1, wherein the first pulse sequence comprises a pre-programmed number of pulse repetition periods, and wherein completing obtaining data in accordance with the first pulse sequence comprises completing operating the MRI system for the pre-programmed number of pulse repetition periods in accordance with parameters of the first pulse sequence.

3. The method of claim 1, wherein the first pulse sequence is one of a diffusion weighted imaging (DWI) pulse sequence or a spin echo pulse sequence.

4. The method of claim 1, wherein:
determining to collect the additional data is performed by determining that a first subset of the data obtained in accordance with the first pulse sequence was affected by one or more artefacts; and
determining the parameters for the second pulse sequence is based on parameters of the first pulse sequence used to obtain the first subset of the data.

5. The method of claim 4, wherein determining that the first subset of data was affected by the one or more artefacts is performed using information indicating that the subject moved during collection of the first subset of data.

6. The method of claim 5, further comprising obtaining the information indicating that the subject moved during collection of the first subset of data, wherein obtaining the information indicating that the subject moved is performed using at least one sensor configured to detect motion of the subject.

7. The method of claim 5, further comprising obtaining the information indicating that the subject moved during collection of the first subset of data, wherein obtaining the information indicating that the subject moved during collection of the first subset of data comprises determining that the subject moved by processing the data collected in accordance with the first pulse sequence.

8. The method of claim 4, wherein determining that the first subset of data was affected by the one or more artefacts is performed using information indicating the presence of one or more of: external RF interference generated by one or more devices external to the MRI system, internal RF interference generated by one or more components of the MRI system outside of its imaging region, and/or noise generated by receive circuitry of the MRI system.

9. The method of claim 8, further comprising obtaining, using one or more sensors, information indicating that the first subset of data was affected by external RF interference generated by one or more devices external to the MRI system wherein the one or more sensors include at least one RF coil positioned outside of the imaging region of the MRI system and configured to detect external RF interference.

10. The method of claim 1, wherein determining to collect the additional data comprises:
calculating a measure of MR image quality using data collected in accordance with the first pulse sequence; and
determining to collect the additional data when the measure of MR image quality is below a specified threshold and/or outside a specified range.

11. The method of claim 1, wherein determining to collect the additional data comprises determining to collect additional data corresponding to one or more k-space coordinates not sampled by the first pulse sequence.

12. The method of claim 1, wherein determining parameters for the second pulse sequence comprises:
determining an initial set of parameters for one or more RF pulses and/or gradient waveforms to be generated as part of the second pulse sequence using the parameters of the first pulse sequence used to obtain the first subset of the data; and
adjusting the initial set of parameters to compensate for a presence of eddy currents during operation of the MRI system.

13. The method of claim 12, wherein adjusting the initial set of parameters to compensate for the presence of eddy currents during operation of the MRI system comprises:
correcting a gradient waveform generated in accordance with the second pulse sequence and associated with a target gradient field using a non-linear function of a characteristic of the gradient waveform to obtain a corrected gradient waveform; and
operating the MRI system in accordance with the second pulse sequence comprises operating the MRI system in accordance with the corrected gradient waveform to generate the target gradient field.

14. The method of claim 1, wherein determining parameters for the second pulse sequence comprises:
determining an initial set of parameters for one or more RF pulses and/or gradient waveforms to be generated as part of the second pulse sequence using the parameters of the first pulse sequence used to obtain the first subset of the data; and
adjusting the initial set of parameters to compensate for effects of hysteresis in the MRI system.

15. The method of claim 14, wherein adjusting the initial set of parameters to compensate for effects of hysteresis in the MRI system comprises:
determining a corrected pulse sequence to control the at least one gradient coil based on the first pulse sequence and a hysteresis model of induced magnetization of the MRI system caused by operation of the at least one gradient coil; and
operating the MRI system in accordance with the second pulse sequence comprises controlling, using the corrected pulse sequence, the at least one gradient coil to generate one or more gradient pulses for imaging a patient.

16. The method of claim 1, wherein the determining to collect additional data to augment and/or replace the at least some of the obtained data is repeated at least once during the obtaining the data in accordance with the first pulse sequence.

17. The method of claim 1, further comprising:
prior to completing the obtaining the additional data in accordance with the second pulse sequence, determining to collect additional data to augment and/or replace at least some of the obtained additional data in accordance with the second pulse sequence;
determining a third pulse sequence to use for obtaining the additional data to augment and/or replace the at least some of the obtained additional data in accordance with the second pulse sequence; and
after completing the obtaining the additional data in accordance with the second pulse sequence, obtaining the additional data by operating the MRI system in accordance with the third pulse sequence.

18. The method of claim 1, wherein the determining to collect additional data to augment and/or replace at least some of the obtained data is further based on a difference between a time spent obtaining the data in accordance with the first pulse sequence and an allotted time for performing imaging.

19. A magnetic resonance imaging (MRI) system for imaging a subject, the MRI system comprising:
a plurality of magnetics components including at least one gradient coil and at least one radio-frequency (RF) coil; and at least one controller configured to:
- obtain data for generating at least one magnetic resonance image of the subject by operating the MRI system in accordance with a first pulse sequence;
- prior to completing the obtaining the data in accordance with the first pulse sequence, determine to collect additional data to augment and/or replace at least some of the obtained data;
- determine a second pulse sequence to use for obtaining the additional data, wherein determining the second pulse sequence comprises determining parameters for the second pulse sequence based on a state of the MRI system subsequent to operating the MRI system in accordance with the first pulse sequence; and
- after completing the obtaining the data in accordance with the first pulse sequence, obtaining the additional data by operating the MRI system in accordance with the second pulse sequence.

20. At least one non-transitory computer-readable storage medium having encoded thereon executable instructions that, when executed by at least one computer hardware processor, cause the at least one computer hardware processor to perform a method for imaging a subject using a magnetic resonance imaging (MRI) system, the MRI system comprising a plurality of magnetics components including at least one gradient coil and at least one radio-frequency (RF) coil, the method comprising:
- obtaining data for generating at least one magnetic resonance image of the subject by operating the MRI system in accordance with a first pulse sequence;
- prior to completing the obtaining the data in accordance with the first pulse sequence, determining to collect additional data to augment and/or replace at least some of the obtained data;
- determining a second pulse sequence to use for obtaining the additional data, wherein determining the second pulse sequence comprises determining parameters for the second pulse sequence based on a state of the MRI system subsequent to operating the MRI system in accordance with the first pulse sequence; and
- after completing the obtaining the data in accordance with the first pulse sequence, obtaining the additional data by operating the MRI system in accordance with the second pulse sequence.

* * * * *